(12) United States Patent
Katsuoka et al.

(10) Patent No.: US 7,959,977 B2
(45) Date of Patent: Jun. 14, 2011

(54) SUBSTRATE PROCESSING METHOD AND APPARATUS

(75) Inventors: Seiji Katsuoka, Tokyo (JP); Masahiko Sekimoto, Tokyo (JP); Toshio Yokoyama, Tokyo (JP); Teruyuki Watanabe, Tokyo (JP); Takahiro Ogawa, Tokyo (JP); Kenichi Kobayashi, Tokyo (JP); Mitsuru Miyazaki, Tokyo (JP); Yasuyuki Motojima, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 12/771,176

(22) Filed: Apr. 30, 2010

(65) Prior Publication Data

US 2010/0221432 A1 Sep. 2, 2010

Related U.S. Application Data

(62) Division of application No. 10/712,373, filed on Nov. 14, 2003, now Pat. No. 7,735,451.

(30) Foreign Application Priority Data

Nov. 15, 2002 (JP) .................................. 2002-332944
Nov. 18, 2002 (JP) .................................. 2002-334277

(51) Int. Cl.
*B05D 3/10* (2006.01)
*C23C 18/18* (2006.01)
*C23C 18/28* (2006.01)
*C23C 18/30* (2006.01)

(52) U.S. Cl. ...... 427/304; 427/99.1; 427/99.5; 427/265; 427/305; 427/306

(58) Field of Classification Search .................. 427/99.1, 427/304

See application file for complete search history.

(56) References Cited

U.S. PATENT DOCUMENTS

| | | | | |
|---|---|---|---|---|
| 4,100,037 A | * | 7/1978 | Baron et al. | 205/118 |
| 4,585,517 A | | 4/1986 | Stemple | |
| 5,584,936 A | | 12/1996 | Pickering et al. | |
| 5,922,133 A | | 7/1999 | Tepman et al. | |
| 6,344,413 B1 | | 2/2002 | Zurcher et al. | |
| 6,352,623 B1 | | 3/2002 | Volodarsky et al. | |
| 6,436,615 B1 | * | 8/2002 | Brandow et al. | 430/324 |
| 6,451,114 B1 | | 9/2002 | Stevens | |
| 2002/0063097 A1 | * | 5/2002 | Fukunaga et al. | 210/656 |

FOREIGN PATENT DOCUMENTS

JP 05-218048 * 8/1993
WO 02/47139 6/2002

OTHER PUBLICATIONS

English language abstract for Japanese Application No. 2001-316881, Nov. 2001.
English language abstract for Japanese Application No. 2002-317300, Oct. 2002.
English language abstract for Japanese Application No. 2001-020096, Jan. 2001.
English language abstract for Japanese Application No. 2002-285343, Oct. 2002.

* cited by examiner

*Primary Examiner* — Katherine A Bareford
(74) *Attorney, Agent, or Firm* — Wenderoth, Lind & Ponack, L.L.P.

(57) ABSTRACT

A substrate processing method and apparatus can securely carry out a pre-plating treatment that enables uniform plating in the necessary area of the surface of a substrate. The substrate processing method carries out a cleaning treatment and a catalyst-imparting treatment of a surface of a substrate as pre-plating treatments and then electroless plates a metal film on the catalyst-imparted surface of the substrate. The cleaning treatment is carried out in a wider area of the surface of the substrate than that area to which a catalyst is imparted by the catalyst-imparting treatment.

4 Claims, 17 Drawing Sheets

F I G. 4
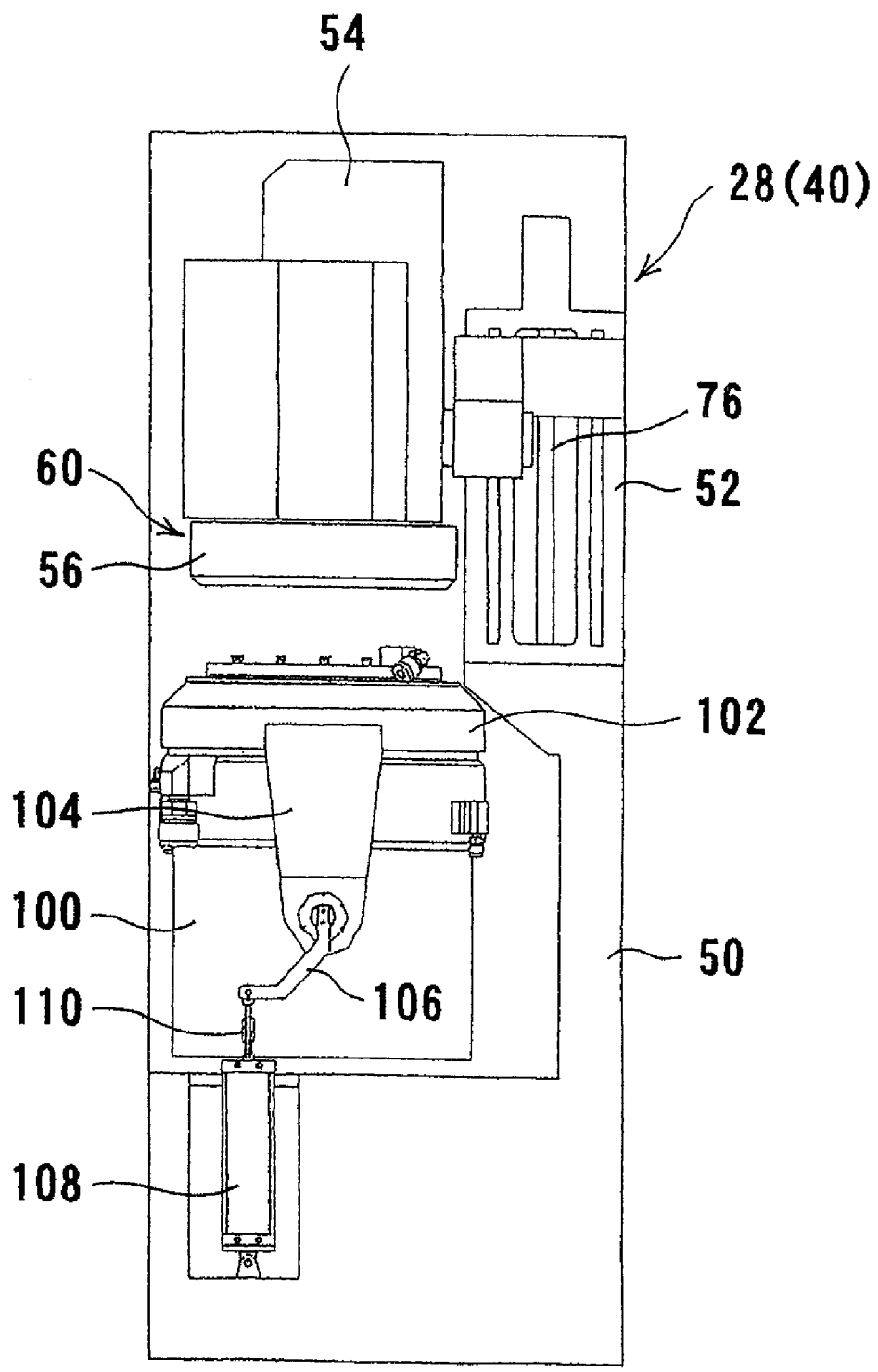

SUBSTRATE PROCESSING METHOD AND APPARATUS

This application is a divisional of U.S. application Ser. No. 10/712,373, now U.S. Pat. No. 7,735,451, filed Nov. 14, 2003.

BACKGROUND OF THE INVENTION

1. Field of the Invention

The present invention relates to a substrate processing method and apparatus, and more particularly to a substrate processing method and apparatus useful for a pre-plating treatment which may be performed before electroless plating for the formation of an interconnects-protective layer on exposed surfaces of embedded interconnects of a conductive material, such as copper, silver or gold, embedded in fine interconnect trenches formed in a surface of a substrate, such as a semiconductor wafer.

The present invention also relates to a substrate processing unit useful for performing processing, such as plating and a pre-plating treatment, of a front surface (lower surface) of a substrate while holding the substrate with the front surface facing downward and with a peripheral portion of the front surface sealed. In particular, a substrate processing unit is used as a pre-plating treatment unit to perform a pre-plating treatment in advance of electroless plating for a formation of an interconnects-protective layer on exposed surfaces of embedded interconnects of a conductive material, such as copper, silver or gold, embedded in fine interconnect trenches formed in a surface of a substrate, such as a semiconductor wafer.

2. Description of the Related Art

As a process for forming interconnects in a semiconductor device, a so-called "damascene process", which comprises embedding a metal (electric conductor) into trenches for interconnects and contact holes, is coming into practical use. According to this process, aluminum, or more recently a metal such as silver or copper, is embedded into trenches for interconnects and contact holes previously formed in an inter-level dielectric of a semiconductor substrate. Thereafter, extra metal is removed by performing chemical mechanical polishing (CMP) so as to flatten a surface of the substrate.

In a case of interconnects formed by such a process, for example copper interconnects formed by using copper as an interconnect material, embedded copper interconnects have exposed surfaces after the flattening processing. In order to prevent thermal diffusion of such interconnects (copper), or to prevent oxidation of such interconnects (copper) e.g. during forming thereon an insulating film (oxide film) under an oxidizing atmosphere to produce a semiconductor device having a multi-layer interconnect structure, it is now under study to selectively cover the exposed surfaces of interconnects with an interconnects-protective layer (cap material) composed of a Co alloy, a Ni alloy or the like so as to prevent thermal diffusion and oxidation of the interconnects. Such an interconnects-protective layer of a Co alloy, a Ni alloy or the like can be produced e.g. by performing electroless plating.

As shown in FIG. 19, for example, fine recesses 4 are formed in an insulating film 2 of $SiO_2$ or the like which has been deposited on a surface of a substrate W such as a semiconductor wafer. A barrier layer 6 of TaN or the like is formed on the entire surface, and then copper plating, for example, is carried out onto the surface of the substrate W to fill the fine recesses 4 with copper and deposit copper on the insulating film 2. Thereafter, CMP (chemical mechanical polishing) is carried out onto the surface of the substrate W so as to flatten the surface of the substrate, thereby forming interconnects 8 composed of a copper film in the insulating film 2. Thereafter, an interconnects-protective layer (cap material) 9 composed of a Co—W—B alloy film is formed e.g. by performing electroless plating selectively on the surfaces of interconnects (copper film) 8 to protect interconnects 8.

A common electroless plating method for the selective formation of the interconnects-protective layer (cap material) 9 of Co—W—B alloy film on the surfaces of interconnects 8 generally involves the following process steps: First, the substrate W such as a semiconductor wafer, which has undergone the CMP treatment, is immersed in an acid solution e.g. of 0.5 M $H_2SO_4$ at the solution temperature of e.g. 25° C. for e.g. one minute to remove CMP residues, such as copper, remaining on a surface of an insulating film 2. After cleaning the surface of the substrate W with a cleaning liquid such as ultrapure water, the substrate W is immersed in a mixed solution, e.g. of 0.005 g/L $PdCl_2$ and 0.2 ml/L HCl, at the solution temperature of e.g. 25° C. for e.g. one minute to adhere Pd as a catalyst to the surfaces of interconnects 8, thereby activating the exposed surfaces of interconnects 8. Next, after cleaning the surface of the substrate W with a cleaning liquid such as ultrapure water, the substrate W is immersed in a solution containing e.g. 20 g/L of $Na_3C_6H_5O.2H_2O$ (sodium citrate) at the solution temperature of e.g. 25° C., thereby carrying out neutralization treatment of the surfaces of interconnects 8. Thereafter, after washing the surface of the substrate W with ultrapure water, the substrate W is immersed in a Co—W—B plating solution at the solution temperature of e.g. 80° C. for e.g. 120 seconds, thereby carrying out selective electroless plating (electroless Co—W—B cap plating) onto the activated surfaces of interconnects 8. Thereafter, the surface of the substrate W is cleaned with a cleaning liquid such as ultrapure water. The interconnects-protective layer 9 composed of a Co—W—B alloy film is thus formed selectively on the surfaces of interconnects 8 to protect interconnects 8.

As described above, when forming an interconnects-protective layer (cap material) composed of a Co—W—B alloy film by electroless plating, a catalyst-imparting treatment for imparting a catalyst, for example Pd, to the surfaces of interconnects is carried out in advance. Further, removal of CMP residues, e.g. copper, remaining on an insulating film, which treatment is necessary for preventing an interconnects-protective layer from being formed on the insulating film, is carried out by usually using an inorganic acid, such as $H_2SO_4$ or HCl. Accordingly, it is necessary to carry out a neutralization step immediately before performing plating to stabilize the plating process.

In order to securely perform uniform plating in the necessary area of the surface of a substrate after performing a pre-plating treatment, it is necessary to securely impart a catalyst only to that area (plating area) in the catalyst-imparting treatment, and effect a neutralization treatment, etc. over the whole area to which a catalyst has been imparted.

In conventional plating apparatuses, however, a pre-cleaning treatment (chemical cleaning), which is carried out prior to a catalyst-imparting treatment, a catalyst-imparting treatment and a cleaning treatment (neutralization treatment) after the catalyst-imparting treatment, are generally carried out by using devices each having the same construction. Accordingly, the respective areas of a substrate to be subjected to the pre-cleaning (chemical cleaning), to the catalyst-imparting treatment and to the cleaning (neutralization) after the catalyst-imparting treatment are basically the same. With such a conventional apparatus, due to a device error, a variation in positioning of a substrate when it is held, etc., there is a case where that area of the substrate to which a catalyst will be imparted is not entirely pre-cleaned (with a chemical) or a case where the area of the substrate to which the catalyst has been imparted is not entirely cleaned (neutralized) later, whereby plating cannot be effected securely in the necessary area of the surface of the substrate.

The above-described pre-plating treatments are usually carried out by holding a substrate with its front surface facing downward (face down) while sealing a peripheral portion of the front surface with a seal ring, and allowing the front surface (lower surface) of the substrate to be in contact with a pre-plating treatment liquid. In a conventional substrate processing unit, in particular a pre-plating treatment unit for carrying out such a pretreatment, there is no space between a substrate and a seal ring, i.e. on the front surface (lower surface) side of the substrate, for taking in and out a robot hand when holding the substrate while sealing the peripheral portion with the seal ring or when carrying the substrate out after the treatment. It is therefore a usual practice with such a unit to attract and hold on the back surface (upper surface) side of a substrate by a vacuum hand or gripper hand when transferring the substrate and placing the substrate at a predetermined position on a seal ring or taking the substrate away from the seal ring.

However, holding and transferring a substrate by vacuum attraction with a vacuum hand, foe example, generally involves a considerable loss of time, taking much time to hold the substrate. Further, there is always a risk of fall of the substrate when the substrate held by a vacuum hand is transferred at a high speed. It is therefore necessary to use a low substrate transfer speed in order to avoid the risk of fall of substrate, leading to a lowered throughput.

It may be considered to raise the substrate transfer speed by separately taking safety measures against the fall of substrate, for example, provision of a mechanical chuck. Such safety measures, however, would make the apparatus complicated. In addition to the foregoing, holding a substrate by vacuum attraction of the central portion of even the back surface could cause generation of particles. There is therefore a demand for a technology that makes it possible to hold a substrate without contact with the other portion of the substrate other than a particular peripheral portion, a so-called edge-cut portion.

SUMMARY OF THE INVENTION

The present invention has been made in view of the above situation in the related art. It is therefore a first object of the present invention to provide a substrate processing method and apparatus which can securely carry out a pre-plating treatment that enables uniform plating in the necessary area of the surface of a substrate.

It is a second object of the present invention to provide a substrate processing unit which can quickly and securely hold a substrate and transfer the substrate without a risk of fall of the substrate, thereby increasing the throughput.

In order to achieve the above objects, the present invention provides a substrate processing method comprising: carrying out a cleaning treatment and a catalyst-imparting treatment of a surface of a substrate as pre-plating treatments; and then electroless plating a metal film on the catalyst-imparted surface of the substrate, wherein the cleaning treatment is carried out in a wider area of the surface of the substrate than that area to which a catalyst is imparted by the catalyst-imparting treatment.

The above method makes it possible, for example, to fully pre-clean (with a chemical) the whole area of the surface of a substrate to which a catalyst is to be imparted and fully clean (neutralize) the whole area to which the catalyst has been imparted, whereby plating can then be carried out securely in the necessary area of the surface of the substrate.

In a preferred embodiment of the present invention, the cleaning treatment as a pre-plating treatment comprises pre-cleaning prior to the catalyst-imparting treatment and cleaning after the catalyst-imparting treatment. The pre-plating treatments are carried out in the order of the pre-cleaning (chemical cleaning), the catalyst-imparting treatment and the cleaning (neutralization treatment). Thereafter, electroless plating is carried out by allowing the surface of the substrate to be in contact with an electroless plating solution.

It is preferred that the area of the surface of the substrate to which a catalyst is imparted by the catalyst-imparting treatment be the same as that area for which uniform plating is necessary. This prevents a catalyst from being imparted also to an area of the surface of the substrate for which plating is unnecessary, thereby preventing the unnecessary area from being plated later.

The present invention also provides a substrate processing apparatus comprising: a cleaning treatment unit for carrying out a cleaning treatment of a substrate; and a catalyst-imparting treatment unit for carrying out a catalyst-imparting treatment of the substrate. respective treatment is carried out as a pre-plating treatment by allowing the surface of the substrate to be in contact with a respective pre-plating treatment liquid while sealing a peripheral portion of the surface of the substrate with a seal ring. The cleaning treatment unit is designed to carry out the cleaning treatment in a wider area of the surface of the substrate than that area to which a catalyst is imparted in the catalyst-imparting treatment unit.

In a preferred embodiment of the present invention, the cleaning treatment unit and the catalyst-imparting treatment unit have the same construction except that the seal rings have different opening areas. This makes it possible to standardize the respective units.

It is preferred that the area of the surface of the substrate to which a catalyst is imparted in the catalyst-imparting treatment unit be the same as that area for which uniform plating is necessary.

The present invention also provides a substrate processing unit comprising: a substrate receiving ring to which a seal ring is mounted; a vertically movable substrate holder having a substrate fixing ring for holding a substrate by nipping a peripheral portion of the substrate between the substrate fixing ring and the seal ring; and a temporary retaining section, mounted to the substrate receiving ring and positioned around the seal ring, for temporarily retaining the substrate while forming a space between the substrate and the seal ring.

According to the substrate processing unit, a space is formed between a substrate and the seal ring when temporarily retaining the substrate on the temporary retaining portion or taking the substrate out of the temporary retaining portion. A thin drop-in type hand, for example, may enter (or leave) the space and hold the lower surface side of the substrate within the edge-cut width of the substrate. This enables holding and transfer of the substrate without any risk of fall of the substrate.

The substrate processing unit may, for example, be a pre-plating treatment unit for carrying out a pre-plating treatment of the substrate prior to plating. The pre-plating treatment unit may, for example, be a catalyst-imparting treatment unit for imparting a catalyst to the surface of the substrate or a cleaning treatment unit for cleaning the surface of the substrate.

In a preferred embodiment of the present invention, the substrate receiving ring and the substrate fixing ring hold the substrate with its front surface facing downward. According to the present invention, even with such a face-down type substrate processing unit, the substrate can be held securely on the front surface (lower surface) side by a hand and transferred without a risk of fall of the substrate.

In a preferred embodiment of the present invention, the temporary retaining section is comprised of a plurality of temporary retaining pins which are biased upwardly by an elastic member, and which lower integrally with the substrate holder against the elastic force of the elastic member as the substrate holder lowers, and return to the original position as the substrate holder rises.

By temporarily retaining a substrate on the temporary retaining section (temporary retaining pins) and lowering the substrate holder to thereby lower the temporary retaining pins, integrally with the substrate holder, against the elastic force of the elastic body, a peripheral portion of the substrate can be nipped between the substrate fixing ring and the seal ring whereby the substrate can be held. Further, by raising the substrate holder after completion of processing (treatment) of the substrate to thereby allow the temporary retaining pins to return, by the elastic force of the elastic member, to the original temporary retaining position, the substrate can be forcibly detached from the seal ring by the elastic force and a space for insertion of a hand can be formed between the substrate and the seal ring.

Preferably, the head portion of each temporary retaining pin has a forward tapered surface for guiding the circumferential end surface of the substrate and positioning the substrate. Thus, when placing the substrate on the temporary retaining pins, positioning of the substrate can be carried out automatically by the tapered surfaces of the head portions of the temporary retaining pins.

The above and other objects, features, and advantages of the present invention will be apparent from the following description when taken in conjunction with the accompanying drawings which illustrates preferred embodiments of the present invention by way of example.

BRIEF DESCRIPTION OF THE DRAWINGS

FIG. 4 is a front view showing the cleaning treatment unit upon pure water cleaning;

DETAILED DESCRIPTION OF THE PREFERRED EMBODIMENTS

Preferred embodiments of the present will now be described with reference to the drawings. The below-described embodiments relate to application to a substrate processing apparatus adapted to efficiently form an interconnects-protective film by electroless plating and also to a substrate processing unit for use in the substrate processing apparatus. The present invention, however, is of course applicable to other substrate processing apparatuses for carrying out electroless plating and other substrate processing units.

Figure 1:
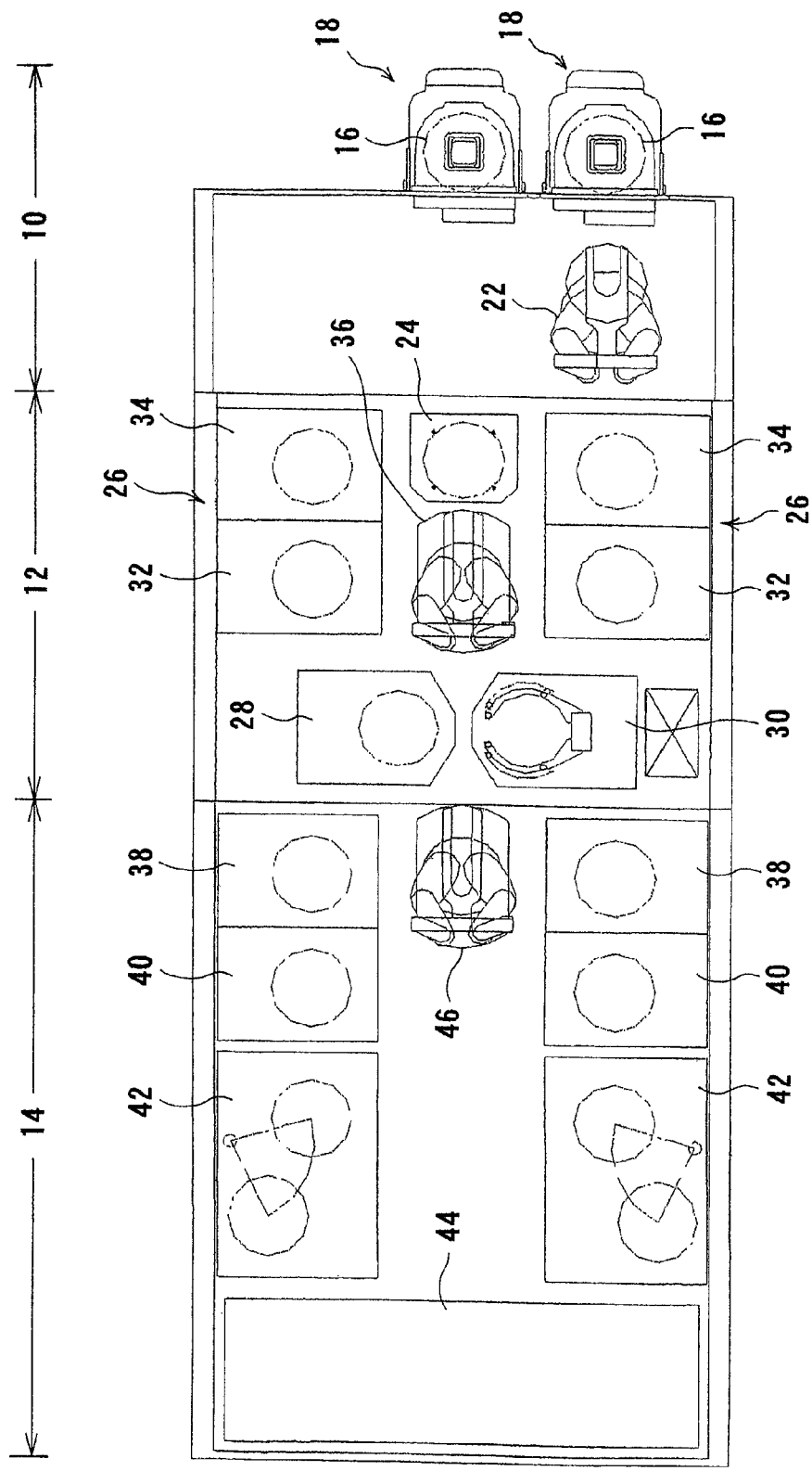
FIG. 1 is a layout plan of a substrate processing apparatus (electroless plating apparatus) according to an embodiment of the present invention.

FIG. 1 is a layout plan of a substrate processing apparatus, which is utilized as an electroless plating apparatus, according to an embodiment of the present invention. As shown in FIG. 1, the substrate processing apparatus (electroless plating apparatus) is divided into three areas: a loading/unloading area 10, a cleaning area and a plating area 14. The electroless plating apparatus is installed in a clean room, and the pressures in the respective areas are set as follows:

pressure in loading/unloading area 10>pressure in cleaning area 12>pressure in plating area 14

Further, the pressure in the loading/unloading area 10 is set to be lower than the pressure in the clean room. This prevents air flowing from the plating area 14 into the cleaning area 12, prevents air flowing from the cleaning area 12 into the loading/unloading area 10, and also prevents air flowing from the loading/unloading area 10 into the clean room.

In the loading/unloading area 10, there are provided two loading/unloading units 18 each for placing thereon and housing a substrate cassette 16 that houses a substrate W having interconnects 8 formed in interconnect recesses 4 formed in the surface (see FIG. 19), and a first transfer robot 22 for transferring the substrate W between the substrate cassette 16 and the below-described first temporary storage stage 24.

In the cleaning area 12, there are provided a first temporary storage stage 24 positioned on the loading/unloading area 10 side, two cleaning/drying treatment units 26 for cleaning and drying the substrate W after plating, positioned on both sides of the first temporary storage stage 24, a first cleaning treatment unit 28 for carrying out a cleaning treatment (chemical cleaning) as a pre-plating treatment, and a second temporary storage stand 30 having a reversing function of reversing the substrate W 180 degrees, both positioned on the plating area 14 side. The cleaning/drying treatment unit 26 comprises a roll brushing unit 32 and a spin-drying unit 34 which carry out two-step cleaning (scrub cleaning and chemical cleaning) and spin-drying of the substrate W after plating. Further, a second transfer robot 36 is disposed in the center of the first temporary storage stage 24, two cleaning/drying treatment units 26, the first cleaning treatment unit 28 and the second temporary storage stage 30 for transfer of the substrate W therebetween.

In the plating area 14, there are provided pairs of catalyst-imparting treatment units 38 for carrying out as a pre-plating treatment a catalyst-imparting treatment of the surface of the substrate W, second cleaning treatment units 40 for carrying out as a pre-plating treatment a cleaning treatment (neutralization treatment) of the catalyst-imparted surface of the substrate W, and electroless plating units 42 for carrying out electroless plating of the surface of the substrate W, each pair being disposed in parallel. Further, a plating solution supply device 44 is disposed at one end of the plating area 14. Furthermore, a movable third transfer robot 46 is disposed in the center of the plating area 14 for transfer of the substrate W between the first cleaning treatment unit 28, the catalyst-imparting treatment unit 42, the second cleaning treatment unit 40, the electroless plating unit 42, and the second temporary storage stage 30.

Figure 19:
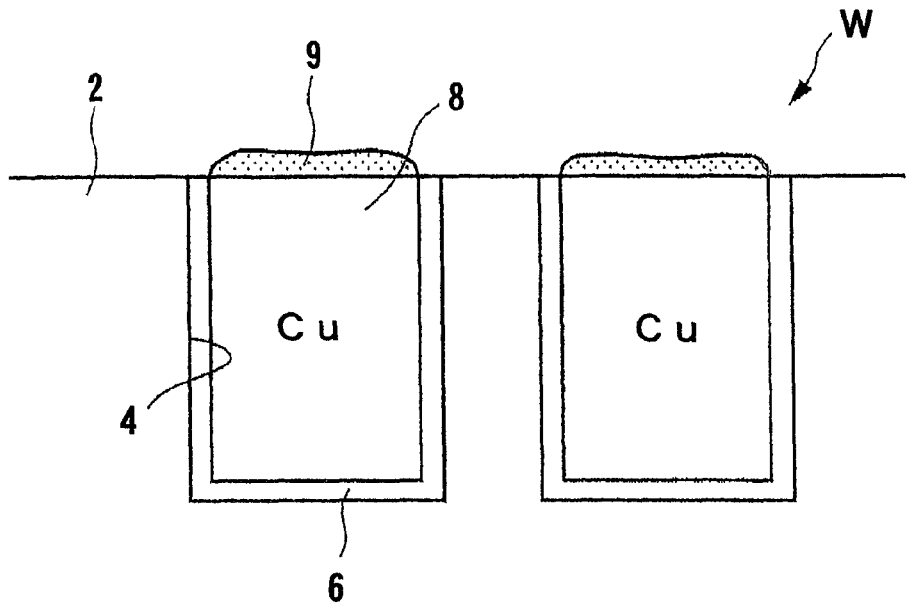
FIG. 19 is a cross-sectional diagram illustrating an interconnects-protective layer formed by electroless plating.

A series of electroless plating processing by the electroless plating apparatus will now be described. In the below-described embodiment, as shown in FIG. 19, an interconnects-protective layer (cap material) 9 of a Co—W—B alloy film is formed selectively on surfaces of interconnects 8 to protect the interconnects 8.

First, a substrate W having interconnects 8 formed in a surface (see FIG. 19) is taken by the first transfer robot 22 out of the substrate cassette 16 placed on the loading/unloading unit 18 and housing substrates W with their front surfaces facing upward (face up), and the substrate W is transferred to and placed on the first temporary storage stage 24. The substrate W on the temporary storage stage 24 is transferred by the second transfer robot 36 to the second temporary storage stage 30, where the substrate W is reversed 180 degrees so that its front surface faces downward (face down). The reversed substrate W is then transferred to the first cleaning treatment unit 28.

In the first cleaning treatment unit 28, the substrate W is held face down and the following pre-cleaning (chemical cleaning) is carried as a pre-plating treatment to the surface of the substrate: An acid solution, such as a 0.5 M $H_2SO_4$ solution, for example at 25° C., is sprayed toward a surface of the substrate W to remove CMP residues, such as copper, remaining on an insulating film 2 (see FIG. 19). Thereafter, the surface of the substrate W is cleaned with a cleaning liquid, such as ultrapure water.

Next, the substrate W after pre-cleaning is transferred by the third transfer robot 46 to the catalyst-imparting treatment unit 38, where the substrate is held face down and a catalyst-imparting treatment of the surface of the substrate is carried out as a pre-plating treatment. The catalyst-imparting treatment is carried out, for example, by spraying a solution containing 0.005 g/L of $PdCl_2$ and 0.2 ml/L of HCl, e.g. at 25° C., toward the substrate W to adhere Pd as a catalyst to the surfaces of interconnects 8. Thus, a Pd seed as a catalyst seed is formed on the surfaces of interconnects 8, whereby the exposed surfaces of interconnects 8 is activated. Thereafter, the surface of the substrate W is cleaned with a cleaning liquid, such as ultrapure water.

The catalyst-imparted substrate W is transferred by the third transfer robot 46 to the second cleaning treatment unit 40, where the substrate W is held face down and a cleaning treatment (neutralization treatment) of the surface of the substrate is carried out as a pre-plating treatment. The cleaning treatment is carried out, for example, by spraying a solution of 20 g/L of $Na_3C_6H_5O_7 \cdot 2H_2O$ (sodium citrate) e.g. at 25° C. toward the substrate W to neutralize the surfaces of interconnects 8, and then water-cleaning the surface of the substrate W with e.g. ultrapure water.

The substrate W, which has undergone the pre-electroless plating treatments, is transferred by the third transfer robot 46 to the electroless plating unit 42, where the substrate W is held face down and electroless plating of the surface of the substrate is carried out. The electroless plating is carried out, for example, by immersing the substrate W in a Co—W—B plating bath at a temperature of about 80° C. e.g. for about 120 seconds to effect selective electroless plating (electroless Co—W—B cap plating) on the activated surfaces of interconnects 8, and then cleaning the surface of the substrate W with a cleaning liquid, such as ultrapure water. Interconnects-protective layer 9 of Co—W—B alloy film (see FIG. 19) is thus selectively formed on the surfaces of interconnects 8.

Next, the substrate W after the electroless plating is transferred by the third transfer robot 46 to the second temporary storage stage 30, where the substrate W is reversed so that its front surface faces upward (face up). The reversed substrate W is transferred by the second transfer robot 36 to the roll brushing unit 32 of the cleaning/drying treatment unit 26, where particles and unnecessary matter adhering to the surface of the substrate W are removed by a roll-shaped brush. Thereafter, the substrate W is transferred by the second transfer robot 36 to the spin-drying unit 34 of the cleaning/drying treatment unit 26, where chemical cleaning and pure water cleaning of the surface of the substrate W are carried out, and the cleaned substrate is spin-dried.

The dried substrate W is transferred by the second transfer robot 36 onto the first temporary storage stage 24, and the substrate W on the stage 24 is returned by the first transfer robot 22 to the cassette 16 placed on the loading/unloading unit 18.

In the case of the embodiment, a Co—W—B alloy film is used as an interconnects-protective layer 9. Specifically, the interconnects-protective layer 9 composed of the Co—W—B alloy film is formed by using a plating solution containing cobalt ions, a complexing agent, a pH buffer, a pH adjusting agent, an alkylamine borane as a reducing agent, and a compound containing tungsten, and dipping the surface of the substrate W in the plating solution.

If desired, the plating solution may further contain at least one of a stabilizer selected from one or more kinds of heavy metal compounds and sulfur compounds, and surfactant. Further, the plating solution is adjusted within a pH range of preferably 5-14, more preferably 6-10, by using a pH adjusting agent such as ammonia water or quaternary ammonium hydroxide. The temperature of the plating solution is generally in the range of 30-90° C., preferably 40-80° C.

The cobalt ions contained in the plating solution may be supplied from a cobalt salt, for example, cobalt sulfate, cobalt chloride or cobalt acetate. The amount of the cobalt ions is generally in the range of 0.001-1.0 mol/L, preferably 0.01-0.3 mol/L.

Specific examples of the complexing agent may include carboxylic acids, such as acetic acid, and their salts; oxycarboxylic acids, such as tartaric acid and citric acid, and their salts; and aminocarboxylic acids, such as glycine, and their salts. These compounds may be used either singly or as a mixture of two or more. The total amount of the complexing agent is generally 0.001-1.5 mol/L, preferably 0.01-1.0 mol/L. Regarding the pH buffer, ammonium sulfate, ammonium chloride and boric acid may be mentioned as specific examples. The pH buffer can be used generally in an amount of 0.01-1.5 mol/L, preferably 0.1-1.0 mol/L.

Regarding the pH adjusting agent, ammonia water and tetramethylammonium hydroxide (TMAH) may be mentioned as specific examples. By using the pH adjusting agent, the pH of the plating solution is adjusted generally within the range of 5-14, preferably 6-10. An alkylamine borane as the reducing agent, dimethylamine borane (DMAB) and diethylamine borane, may be mentioned. The reducing agent is used generally in an amount of 0.01-1.0 mol/L, preferably 0.01-0.5 mol/L.

Examples of the compound containing tungsten may include tangstic acids and their salts; and heteropoly acids, such as tangstophosphoric acid (e.g. $H_3(PW_{12}P_{40}).nH_2O$), and their salts. The compound containing tungsten is used generally in an amount of 0.001-1.0 mol/L, preferably 0.01-0.1 mol/L.

Besides above described compounds, other known additives may be added to the plating solution. Examples of usable additive include a bath stabilizer, which may be a heavy metal compound such as a lead compound, a sulfur compound such as a thiocyanate, or a mixture thereof, and a surfactant of an anionic, cationic or nonionic type.

In the case of the embodiment, a Co—W—B alloy is used as an interconnects-protective layer 9, an interconnects-protective layer composed of Co—B, Ni—B or Ni—W—B alloy may also be used as an interconnects-protective layer 9. Further, though the case of using copper as an interconnect material has been described, it is also possible to use a copper alloy, silver, a silver alloy, gold or a gold alloy etc. other than copper.

A detailed description will now be made of the first cleaning treatment unit (pre-plating treatment unit) 28, the catalyst-imparting treatment unit (pre-plating treatment unit) 38 and the second cleaning treatment unit (pre-plating treatment unit) 40, which are provided in the electroless plating apparatus shown in FIG. 1 and carry out cleaning treatments and a catalyst-imparting treatment as pre-plating treatments. The transfer robots 22, 36, 46, which are respectively provided in the areas 10, 12, 14 of the electroless plating apparatus, have a hand that can transfer the substrate W face up or face down according to process requirements. This makes it possible to carry out a series of process steps for forming an interconnects-protective film by performing electroless plating sequentially in one apparatus.

The substrate W is reversed only by the temporary storage stage 30. Reversing of the substrate W by rotation of the arm of the transfer robot 22, 36 or 46 is not carried out, thereby avoiding a risk of fall of the substrate W upon transfer of the substrate W by the transfer robot 22, 36 or 46.

The first cleaning treatment unit 28 and the second cleaning treatment unit 40 have the same construction, though different treatment liquids (chemical liquids) are used. Further, the catalyst-imparting treatment unit 38 has the same construction as the cleaning treatment units 28, 40 except for using a seal ring having a different opening area, as described later.

FIGS. 2 through 8 show the cleaning treatment unit 28 (40). The cleaning treatment unit 28 (40) employs a two liquid-separation system for preventing mixing of different liquids, and seals a peripheral portion of the lower surface, i.e. the processing surface (front surface), of the substrate W which has been transferred face down and fixes the substrate W by pressing on the back surface side.

The cleaning treatment unit 28 (40) includes a fixed frame 52 that is mounted on the upper part of a frame 50, and a movable frame 54 that moves up and down relative to the fixed frame 52. A processing head 60, which includes a bottomed cylindrical housing portion 56, opening downwardly, and a substrate holder 58, is suspended from and supported by the movable frame 54. In particular, a servomotor 62 for rotating the head is mounted to the movable frame 54, and the housing portion 56 of the processing head 60 is coupled to the lower end of the downward-extending output shaft (hollow shaft) 64 of the servomotor 62.

Figure 5:
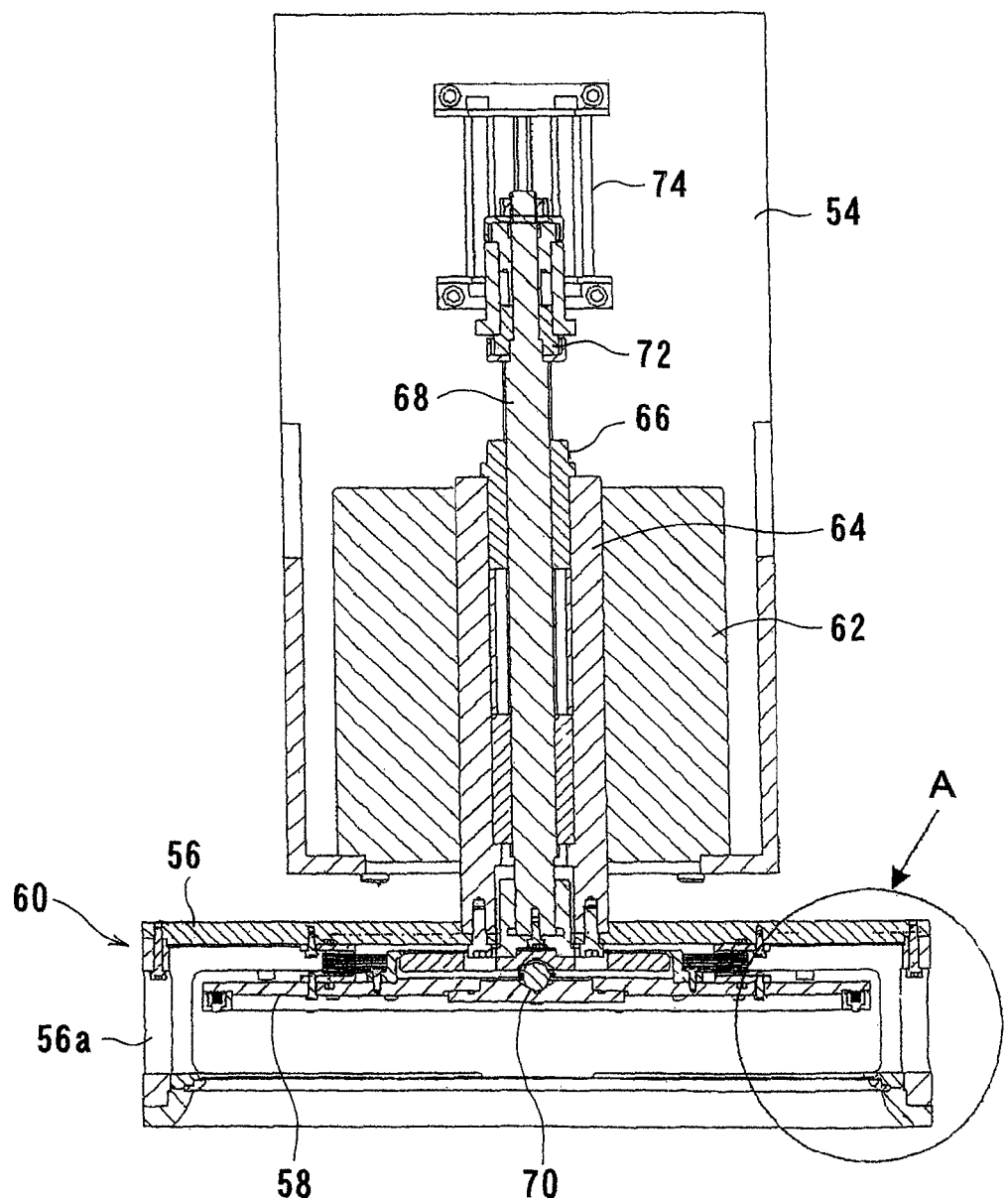
FIG. 5 is a cross-sectional view showing a processing head of the cleaning treatment unit upon transfer of a substrate.

As shown in FIG. 5, a vertical shaft 68, which rotates together with the output shaft 64 via a spline 66, is inserted in the output shaft 64, and the substrate holder 58 of the processing head 60 is coupled to the lower end of the vertical shaft 68 via a ball joint 70. The substrate holder 58 is positioned within the housing portion 56. The upper end of the vertical shaft 68 is coupled via a bearing and a bracket to a fixed ring-elevating cylinder 74 secured to the movable frame 54. Thus, by the actuation of the cylinder 74, the vertical shaft 68 moves vertically independent of the output shaft 64.

Linear guides 76, which extend vertically and guide vertical movement of the movable frame 54, are mounted to the fixed frame 52, so that by the actuation of a head-elevating cylinder (not shown), the movable frame 54 moves vertically by the guide of the linear guides 76.

Figure 6:
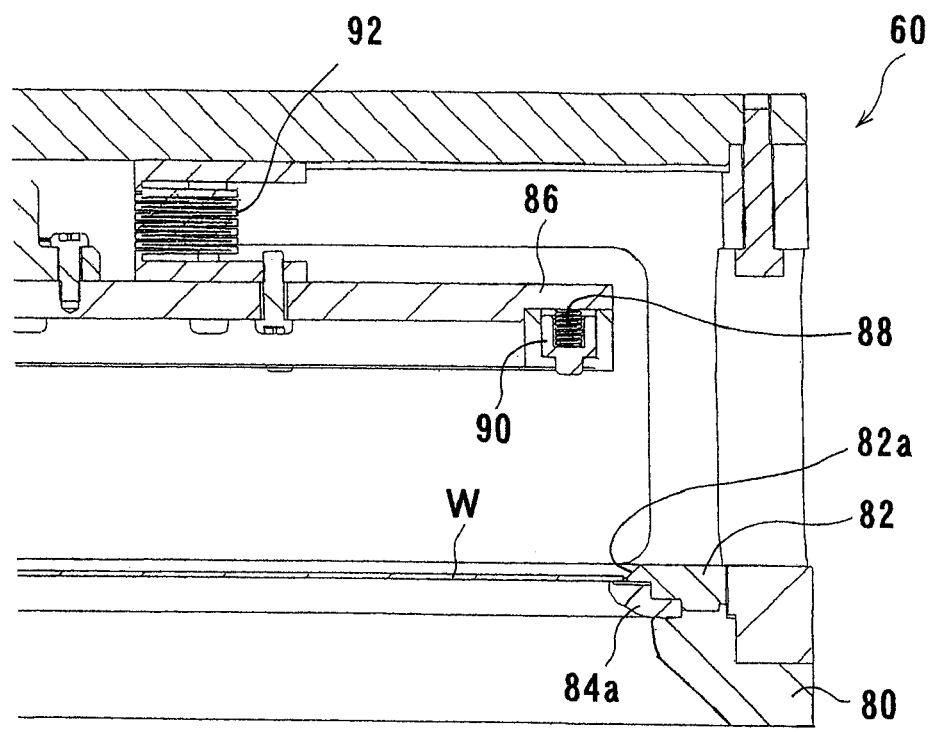
FIG. 6 is an enlarged view of the portion A of FIG. 5.
Figure 7:
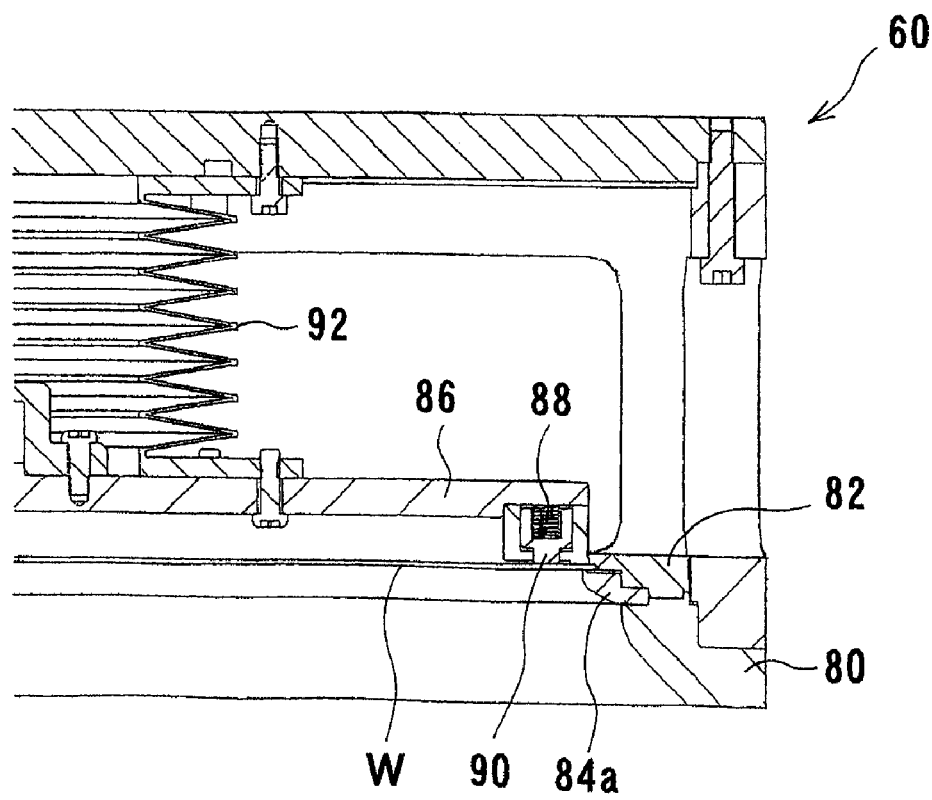
FIG. 7 is a view corresponding to FIG. 6, showing the processing head upon fixing of a substrate.

Substrate insertion windows 56a for inserting the substrate W into the housing portion 56 are formed in the circumferential wall of the housing portion 56 of the processing head 60. Further, as shown in FIGS. 6 and 7, a seal ring 84a is provided in the lower portion of the housing portion 56 of the processing head 60, an outer peripheral portion of the seal ring 84a being sandwiched between a main frame 80 made of e.g. PEEK and a guide frame 82 made of e.g. polyethylene. The seal ring 84a is to make contact with a peripheral portion of the lower surface of the substrate W to seal the peripheral portion.

Figure 8:
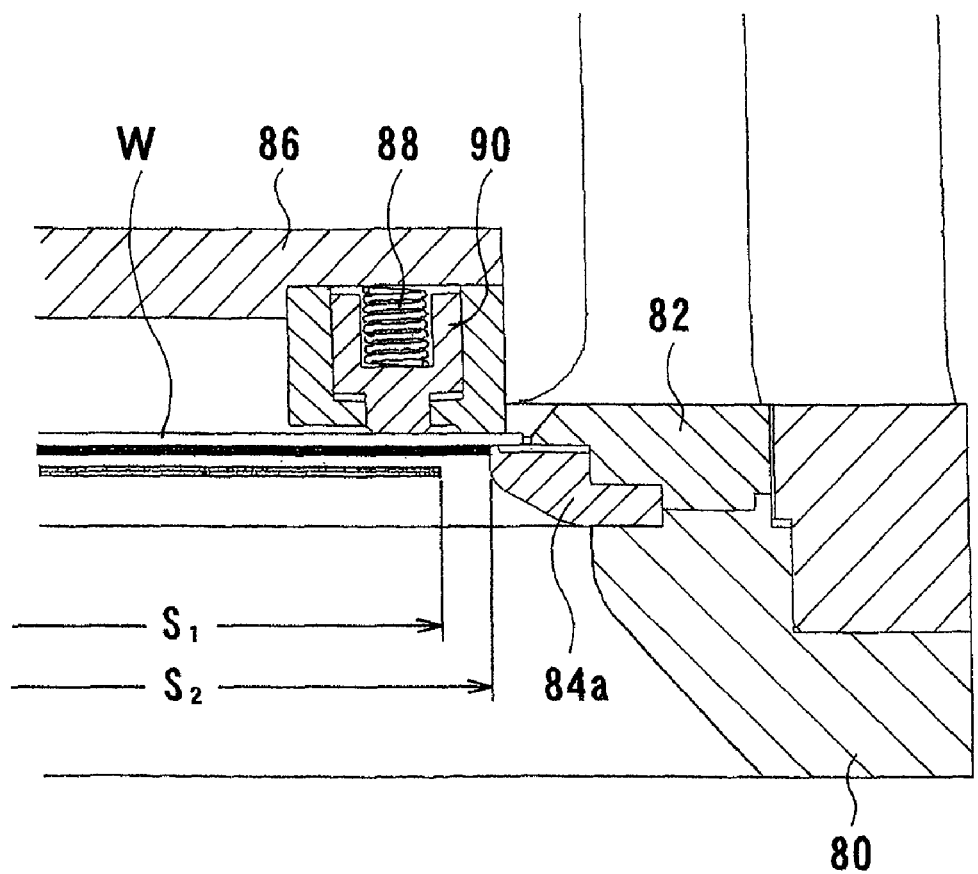
FIG. 8 is an enlarged sectional view of the main portion of the cleaning treatment unit, illustrating an opening area of a seal ring.

As shown in FIG. 8, the seal ring 84a has such an opening area that a cleaning treatment can be effected in a cleaning area $S_2$ which is wider than a catalyst impartation area $S_1$ to which a catalyst is imparted by the catalyst-imparting treatment unit 38. As will be understood, the cleaning area $S_2$ corresponds to the region surrounded by the seal ring 84a and, as will be described later, the catalyst impartation area $S_2$ corresponds to the region surrounded by the below-described seal ring 84b used in the catalyst-imparting treatment unit 38. The cleaning area $S_2$ is concentrically wider than the catalyst impartation area $S_1$.

Accordingly, it is possible with the first cleaning treatment unit 28 to fully pre-clean (with a chemical) that area of the surface of the substrate to which a catalyst is to be imparted by the catalyst-imparting treatment unit 38. With the second cleaning treatment unit 40, it is possible to fully clean (neutralize) the area to which a catalyst has been imparted by the catalyst-imparting treatment unit 38.

On the other hand, a substrate fixing ring 86 is fixed to a peripheral portion of the lower surface of the substrate holder 58. A columnar pusher 90 protrudes downwardly from the lower surface of the substrate fixing ring 86 by the elastic force of a spring 88 disposed within the substrate fixing ring 86 of the substrate holder 58. Further, a flexible cylindrical bellows-like plate 92 made of e.g. Teflon (trademark) is disposed between the upper surface of the substrate holder 58 and the upper wall of the housing portion 56 to hermetically seal the interior of the housing portion.

When the substrate holder 58 is in a raised position, a substrate W is inserted from the substrate insertion window 56a into the housing portion 56. The substrate W is then guided by a tapered surface 82a provided in the inner circumferential surface of the guide frame 82, and positioned and placed at a predetermined position on the upper surface of the seal ring 84a. Thereafter, the substrate holder 58 is lowered so as to bring the pusher 90 of the substrate fixing ring 86 into contact with the upper surface of the substrate W. The substrate holder 58 is further lowered so as to press downwardly on the substrate W by the elastic force of the spring 88, thereby forcing the seal ring 84a to make pressure contact with a peripheral portion of the front surface (lower surface) of the substrate W to seal the peripheral portion while nipping the substrate W between the housing portion 56 and the substrate holder 58 to hold the substrate W.

When the head-rotating servomotor 62 is driven while the substrate W is thus held by the substrate holder 58, the output shaft 64 and the vertical shaft 68 inserted in the output shaft 64 rotate together via the spline 66, whereby the substrate holder 58 rotates together with the housing portion 56.

Figure 2:
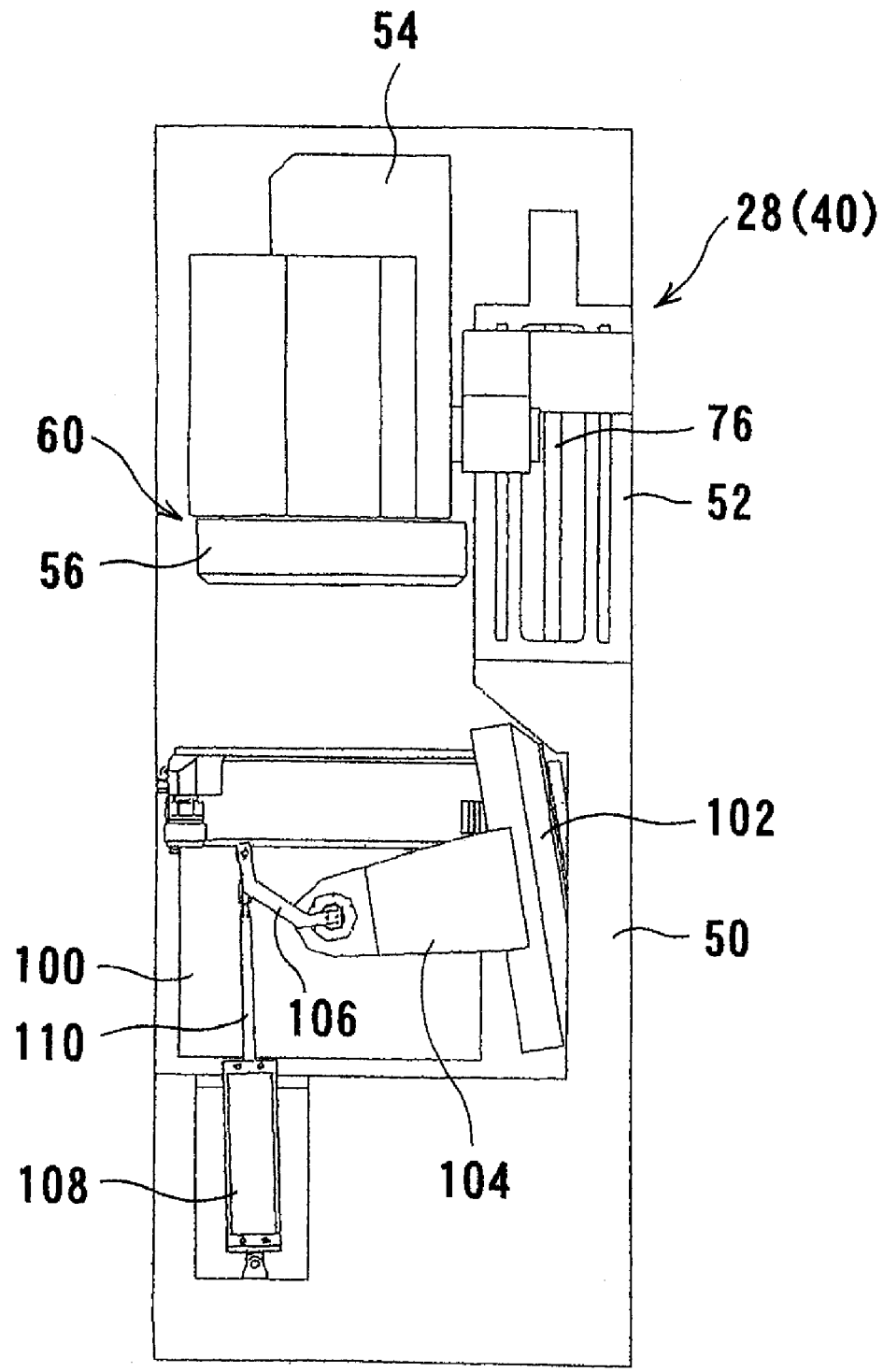
FIG. 2 is a front view showing a cleaning treatment unit upon transfer of a substrate.
Figure 3:
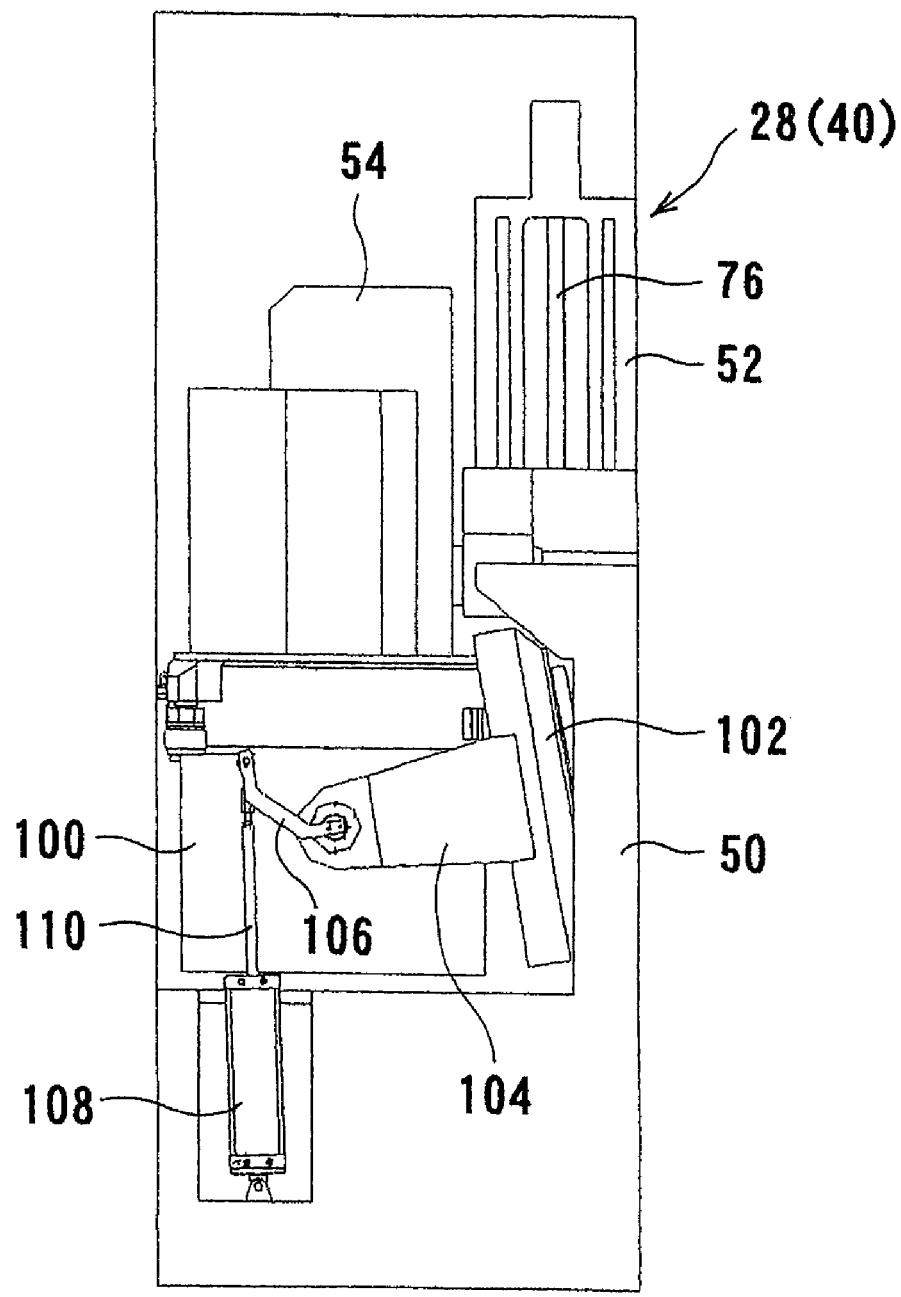
FIG. 3 is a front view showing the cleaning treatment unit upon a cleaning treatment (chemical cleaning or neutralization treatment)

As shown in FIGS. 2 through 4, positioned below the processing head 60, there is provided an upward-open treatment tank 100 having a slightly larger inner diameter than the outer diameter of the processing head 60. In the treatment tank 100 is disposed a plurality of sprays nozzles (not shown) for spraying upwardly a chemical liquid supplied from a chemical liquid supply source, which nozzles are distributed evenly over the entire cross-section of the treatment tank 100. A discharge pipe (not shown) for discharging out the chemical liquid (waste liquid) is connected to the bottom of the treatment tank 100.

A pair of leg portions 104, which is mounted to a lid 102, is rotatably supported on the outer circumferential surface of the treatment tank 100. Further, a crank 106 is integrally coupled to each leg portion 106, and the free end of the crank 106 is rotatably coupled to the rod 110 of a lid-moving cylinder 108. Thus, by the activation of the lid-moving cylinder 108, the lid 102 moves between a treatment position at which the lid 102 covers the top opening of the treatment tank 100 and a retreat position beside the treatment tank 100. In the surface (upper surface) of the lid 102 are provided a large number of pure water spray nozzles 112 for spraying outwardly (upwardly) pure water supplied from a pure water supply source.

By lowering the processing head 60 holding the substrate so as to cover or close the top opening of the treatment tank 100 with the processing head 60 and then spraying a chemical liquid from the spray nozzles disposed in the treatment tank 100 toward the substrate W, the chemical liquid can be sprayed uniformly onto the entire lower surface (processing surface) of the substrate W and the chemical liquid can be discharged out from the discharge pipe while preventing scattering of the chemical liquid to the outside. Further, by raising the processing head 60 and closing the top opening of the treatment tank 100 with the lid 102, and then spraying pure water from the pure water spray nozzles 112 disposed in the upper surface of the lid 102 toward the substrate W held in the processing head 60, the chemical treatment of the substrate W and the pure water cleaning after the chemical treatment can be carried out successively, while the pure water can be prevented from flowing into the treatment tank 100, avoiding mixing of the two liquids.

According to the cleaning treatment unit 28 (40), the substrate W is inserted into the processing head 60 and held therein when the processing head 60 is in the raised position, as shown in FIG. 2. Thereafter, as shown in FIG. 3, the processing head 60 is lowered to the position at which it covers the top opening of the treatment tank 100. While rotating the processing head 60 and thereby rotating the substrate W held in the processing head 60, a chemical liquid is sprayed from the spray nozzles disposed in the treatment tank 100 toward the substrate W, thereby spraying the chemical liquid uniformly onto the entire surface of the substrate W. Thereafter, the processing head 60 is raised and stopped at a predetermined position and, as shown in FIG. 4, the lid 102 in the retreat position is moved to the position at which it covers the top opening of the treatment tank 100. Pure water is then sprayed from the pure water spray nozzles 112 disposed in the upper surface of the lid 102 toward the rotating substrate W held in the processing head 60. The chemical treatment and the pure water cleaning of the substrate W can thus be carried out successively while avoiding mixing of the two liquids.

The lowermost position of the processing head 60 may be adjusted to adjust the distance between the substrate W held in the processing head 60 and the spray nozzles, whereby the region of the substrate W onto which the chemical liquid is sprayed from the spray nozzles and the spraying pressure can be adjusted as desired.

An acid solution, for example a $H_2SO_4$ solution, is used as the chemical liquid in the case of the first cleaning treatment unit 28, while a sodium citrate solution, for example, is used as the chemical liquid in the case of the second cleaning treatment unit 40. In either case, the treated surface of the substrate is cleaned with pure water before it is sent to the next process step.

Figure 9:
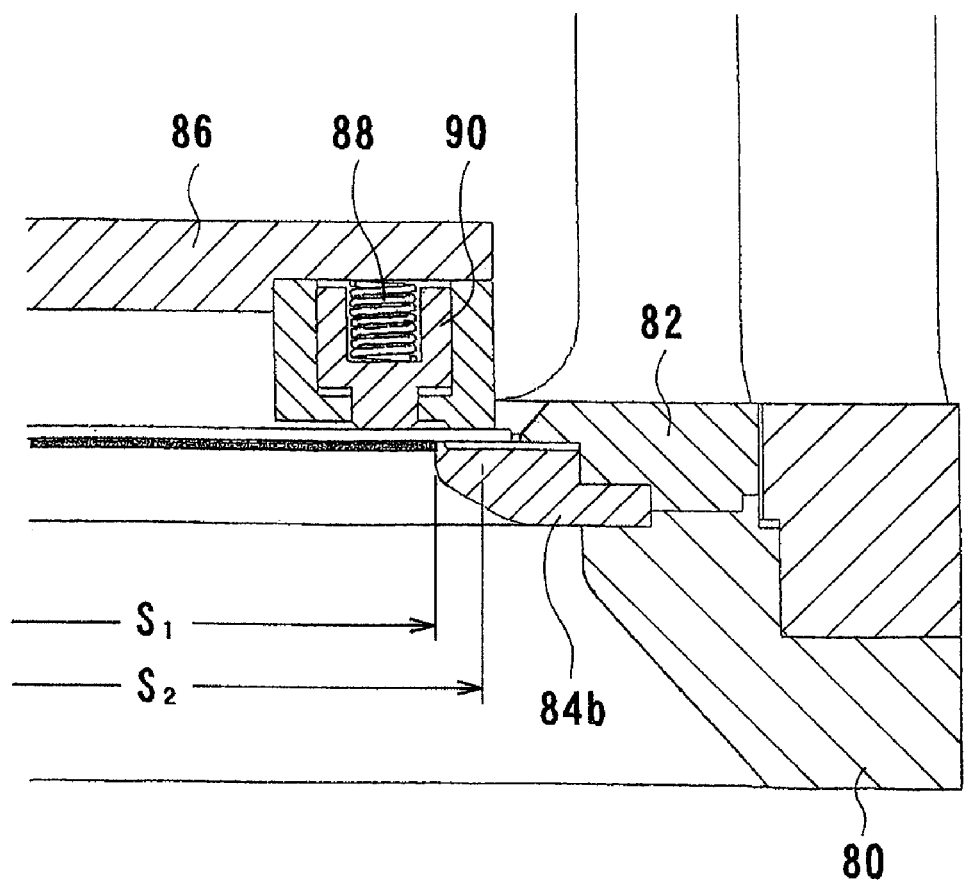
FIG. 9 is a view corresponding to FIG. 8, illustrating an opening area of a seal ring of a catalyst-imparting treatment unit.

FIG. 9 shows the main portion of the catalyst-imparting treatment unit 38, representing a distinctive feature from the above-described cleaning treatment unit 28 (40). In particular, the catalyst-imparting treatment unit uses as a seal ring 84b, which is disposed with its outer peripheral portion sandwiched between the main frame 80 and the guide frame 82 and which makes contact with a peripheral portion of the lower surface of the substrate W to seal the peripheral portion, one having such an opening area that the catalyst impartation area $S_1$ is narrower than the cleaning area $S_2$, that is cleaned by the cleaning treatment unit 28 (40), and is the same as that area of the surface of the substrate in which uniform plating is to be carried out.

As will be understood, the catalyst impartation area $S_1$ corresponds to the region surrounded by the seal ring 84b and, as described above, the cleaning area $S_2$ corresponds to the region surrounded by the seal ring 84a. The catalyst impartation area $S_1$ is concentrically narrower than the cleaning area $S_2$ and identical to the plating area in which uniform plating is to be carried out.

This prevents a catalyst from being imparted also to a portion of the surface of the substrate for which plating is unnecessary, thereby preventing the unnecessary portion from being plated later. Further, as described previously, the first cleaning treatment unit 28 can fully pre-clean (with a chemical) that area of the surface of the substrate to which a catalyst is to be imparted by the catalyst-imparting treatment unit 38, and the second cleaning treatment unit 40 can fully clean (neutralize) the area to which the catalyst has been imparted by the catalyst-imparting treatment unit 38. Accordingly, plating can be carried out securely in the necessary area of the surface of the substrate.

A solution of $PdCl_2$ and HCl, for example, may be used as a chemical liquid in the catalyst-imparting treatment unit 38. As with the above-described cleaning treatment units 28, 40, after imparting a catalyst to the necessary area of the surface of the substrate, the substrate is cleaned with pure water and then sent to the next process step.

As described hereinabove, the present invention makes it possible, in carrying out pre-electroless plating treatments of the surface of a substrate, to securely pre-clean (with a chemical) the whole area of the surface of the substrate to which a catalyst is to be imparted and clean (neutralize) the whole area to which the catalyst has been imparted, thereby enabling a later plating to be carried out securely in the necessary area of the surface of the substrate.

A detailed description will now be made of a substrate processing unit according to another embodiment of the present invention, which is usable as the first cleaning treatment unit (pre-plating treatment unit) 28, the catalyst-imparting treatment unit (pre-plating treatment unit) 38 and the second cleaning treatment unit (pre-plating treatment unit) 40 which are provided in the electroless plating apparatus shown in FIG. 1 and carry out cleaning treatments and a catalyst-imparting treatment as pre-plating treatments.

The same substrate processing unit of this embodiment can be used as the first cleaning treatment unit 28 disposed in the cleaning area 12, and as the catalyst-imparting treatment unit 38 and the second cleaning treatment unit 40 both disposed in the plating area 14, though different treatment liquids (chemical liquids) are used in these treatment units. FIGS. 10 through 18 show the substrate processing unit (pre-plating treatment unit) 150 which is used as the respective treatment unit. The substrate processing unit 150 employs a two-liquid separation system for preventing mixing of different liquids, and seals a peripheral portion of the lower surface, i.e. the processing surface (front surface), of the substrate W which has been transferred face down, and fixes the substrate W by pressing on the back surface.

The substrate processing unit 150 includes a fixed frame 154 that is mounted on the upper portion of a frame 152, and a movable frame 156 that moves up and down relative to the fixed frame 154. A processing head 162, which includes a bottomed cylindrical housing portion 158 opening downwardly, and a substrate holder 160, is suspended from and supported by the movable frame 156. In particular, a servomotor 164 for rotating the head is mounted to the movable frame 156, and the housing portion 158 of the processing head 162 is coupled to the lower end of the downward-extending output shaft (hollow shaft) 166 of the servomotor 164.

Figure 14:
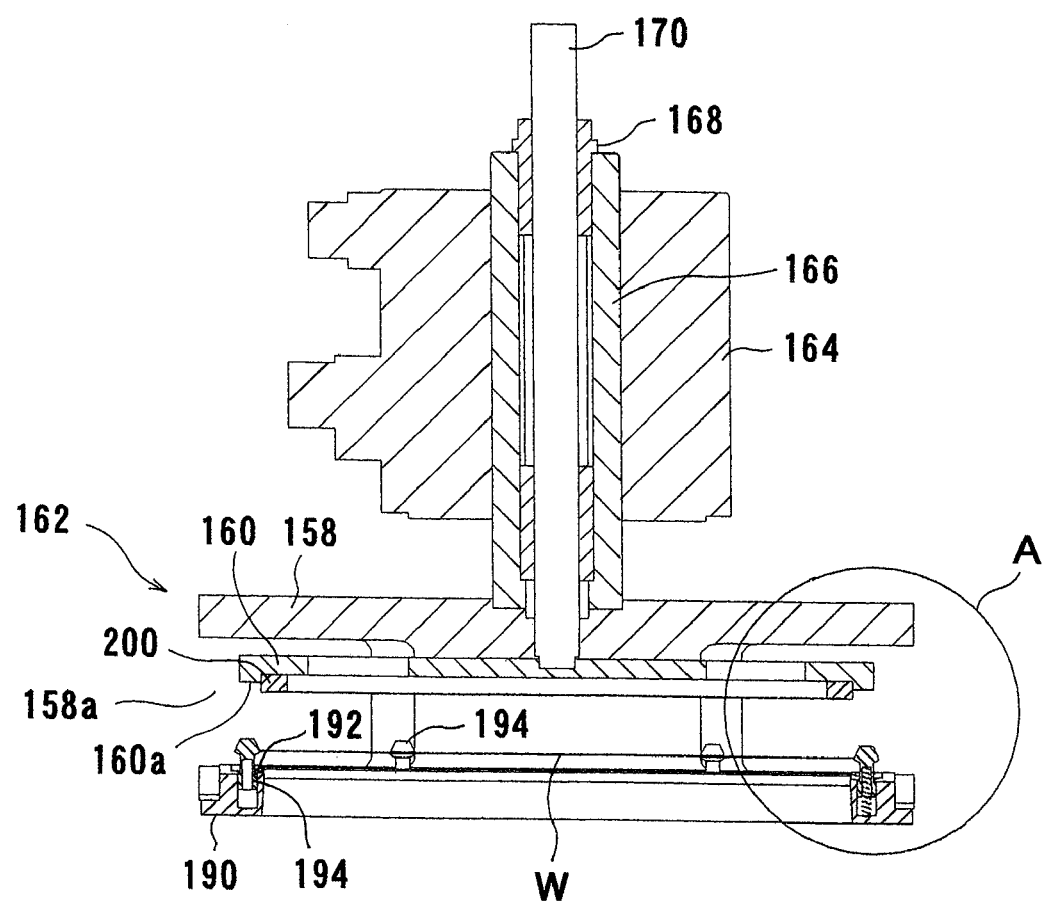
FIG. 14 is a cross-sectional view showing the processing head of the substrate processing unit upon transfer of a substrate.
Figure 15:
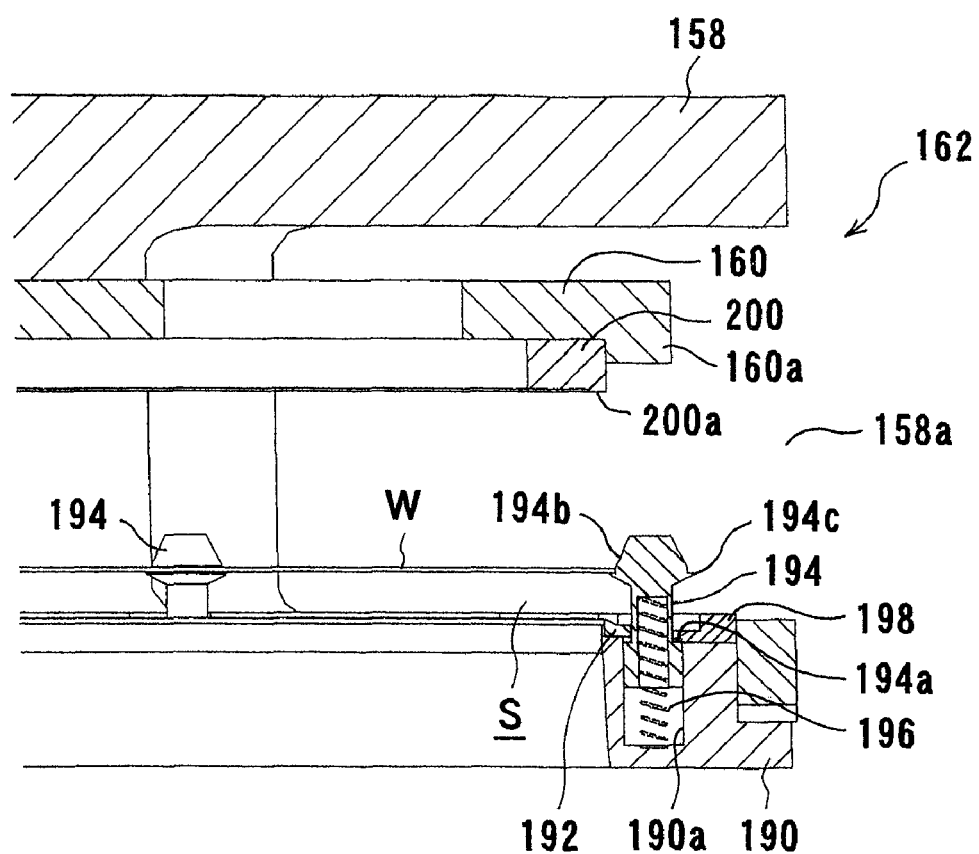
FIG. 15 is an enlarged view of the portion A of FIG. 14.
Figure 16:
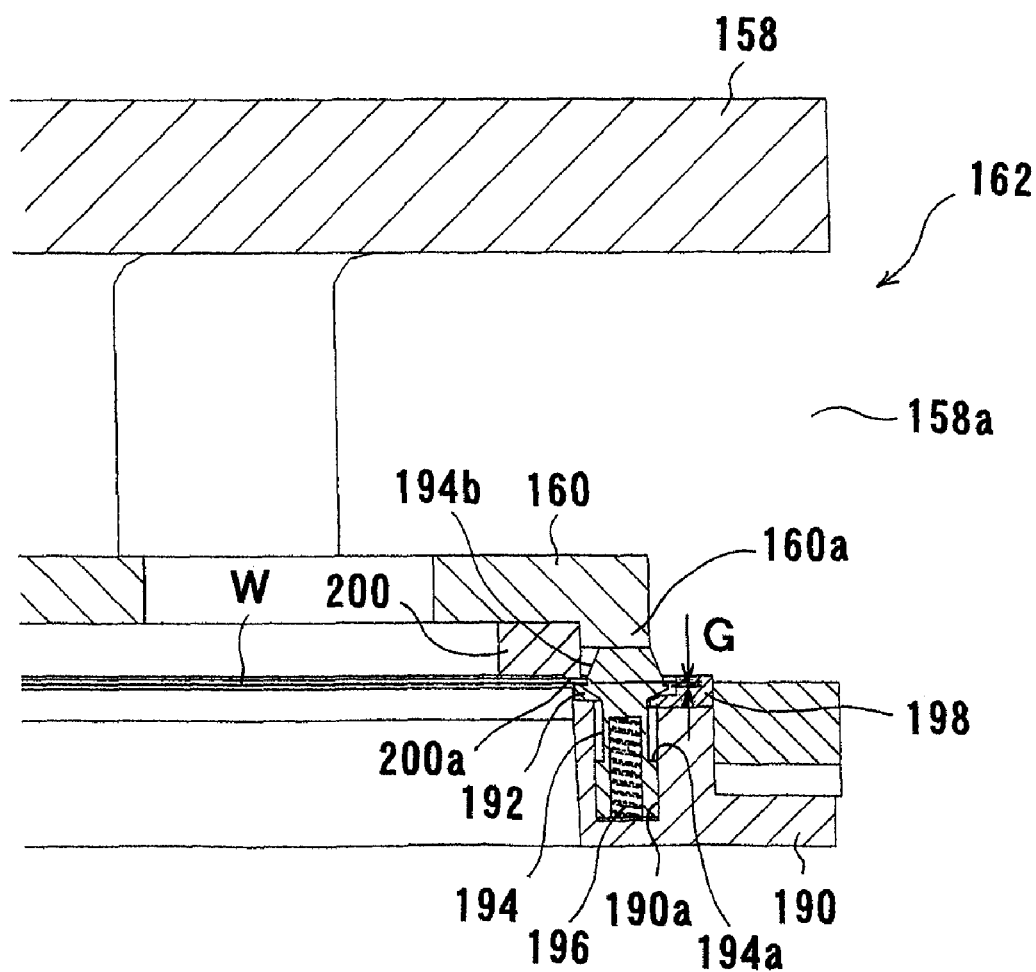
FIG. 16 is a view corresponding to FIG. 15, showing the processing head upon fixing of a substrate.

As shown in FIG. 14, a vertical shaft 170, which rotates together with the output shaft 166 via a spline 168, is inserted in the output shaft 166, and the substrate holder 160 of the processing head 162 is coupled to the lower end of the vertical shaft 170. The substrate holder 160 is positioned within the housing portion 158. The upper end of the vertical shaft 170 is coupled via a bearing 172 and a bracket 174 to a fixed ring-elevating cylinder 176 secured to the movable frame 156. Thus, by the actuation of the cylinder 176, the vertical shaft 170 moves vertically independent of the output shaft 166.

A hook 180 is mounted to the back surface of the movable frame 156 on the fixed frame 154 side, extending backward from the movable frame 156 through a vertically-extending slit 154a formed in the fixed frame 154. The hook 180 is coupled to the upper end of the rod of a head-elevating cylinder 182 that is mounted to the fixed frame 154. Linear guides 184, which extend vertically and guide vertical movement of the movable frame 156, are mounted to the fixed frame 154, so that by the actuation of the head-elevating cylinder 182, the movable frame 156 moves vertically by the guide of the linear guides 184.

Further, the fixed frame 154 is provided with a stopper 186 for head position fixing, while the movable frame 156, at a position corresponding to the stopper 186, is provided with a bolt 188 for head position adjustment, respectively. The lowermost position of the processing head 162 can be fixed mechanically by allowing the adjustment bolt 188 to make contact with the stopper 186. Further, the lowermost position of the processing head 162 can be adjusted by adjusting the position of the stopper 186. In addition, fine adjustment of the lowermost position of the processing head 162 can be made with the adjustment volt 188.

Substrate insertion windows 158a for inserting the substrate W into the housing portion 158 are formed in the circumferential wall of the housing portion 158 of the processing head 162. As shown in detail in FIGS. 15 and 16, positioned on the upper surface of an inner peripheral portion of a substrate receiving ring 190, a seal ring 192, projecting upwardly in a tapered cross-sectional shape, is fixed in the lower portion of the housing portion 158 of the processing head 162. The seal ring 192 is to make contact with a peripheral portion of the lower surface (front surface) of the substrate W to seal the peripheral portion. Further, a plurality of temporary retaining pins (four pins are shown) 194 as a temporary retaining section for temporarily retaining the substrate W are disposed at positions around the outer periphery of the seal ring 192 of the substrate receiving ring 190. Each temporary retaining pin 194 is biased upwardly by a helical compression spring 196 which is housed in a recess 190a formed in the substrate receiving ring 190. A stopper strip 198 mounted on the upper surface of the substrate receiving ring 190 engages a step portion 194a which is formed almost at the middle of the shaft portion of the temporary retaining pin 194, thereby preventing the temporary retaining pin 194 from escaping upward.

The upwardly-projecting head portion of the temporary retaining pin 194 has a forward tapered surface 194b which, when placing the substrate W on the temporary retaining pin 194, contacts the peripheral end surface of the substrate W and effects positioning of the substrate W, and a retaining portion 194c, projecting outwardly in a flange shape, for placing thereon and retaining a peripheral lower surface of the substrate W, the tapered surface 194b and the retaining portion 194c being continuous. A peripheral portion of the lower surface (front surface) of the substrate W may be supported, within the edge-cut region, by a hand H e.g. of a thin drop-in type, and transferred to above the temporary retaining pins 194 in the housing portion 158. When the hand H is lowered, the substrate W is guided and positioned by the tapered surface 194b of the respective pin 194, and placed and temporarily retained on the retaining portion 194c. When the substrate W is thus temporarily retained, a space S is formed between the substrate W and the substrate receiving ring 190, and the hand H can be drawn from the space S. The temporary retaining pins 194, in consideration of corrosion, may be coated e.g. with Teflon (trademark).

On the other hand, a substrate fixing ring 200, having in the outer peripheral lower surface a downward-expanding expanded portion 200a, is mounted integrally to a peripheral portion of the lower surface of the substrate holder 160 at a position corresponding to the seal ring 192. Further, the substrate holder 160 has in the peripheral portion, at positions corresponding to the temporary retaining pins 194, pressing portions 160a, projecting downwardly, for pressing down the temporary retaining pins 194. The positional relationship in the height direction between the substrate fixing ring 200, the pressing portion 160a and the temporary retaining pin 194 is set as follows.

As the substrate holder 160 lowers, the pressing portion 160a of the substrate holder 160 first comes into contact with the upper surface of the head portion of the temporary retaining pin 194. As the substrate holder 160 further lowers, the pressing portion 160a presses down the temporary retaining pin 194 against the elastic force of the helical spring 196. The substrate holder 160 continues to lower even after the lower surface of the substrate W comes into contact with the seal ring 192, thereby nipping a peripheral portion of the substrate W between the seal ring 192 and the substrate fixing ring 200 and allowing the seal ring 192 to make pressure contact with a peripheral portion of the front surface (lower surface) of the substrate to seal the peripheral portion'. As the substrate holder 160 further lowers, a slight gap G is formed between the substrate W and the retaining portion 194c of the temporary retaining pin 194, and the substrate W becomes fixed only by the seal ring 192 and the substrate fixing ring 200.

When the substrate holder 160 is raised after treatment of the substrate W, the temporary retaining pin 194 rises by the elastic force of the helical spring 196, and catches a peripheral portion of the treated substrate W on the retaining portion 194c and detaches the substrate W from the seal ring 192. The temporary retaining pin 194 further rises along with the substrate W, and stops rising by engagement of the step portion 194a with the stopper strip 198. The substrate W is thus returned to the temporary retaining position. By thus forcibly detaching the substrate W from the seal ring 192 by the elastic force of the helical spring 196, the substrate can be securely detached from the seal ring 192 even when the substrate W has adhered to the seal ring 192 during treatment. Further, by returning the substrate W to the temporary retaining position after treatment, it becomes possible to insert the hand H, e.g. of a thin drop-in type, into the space S formed between the substrate W in the temporary retaining position and the substrate receiving ring 190, hold the substrate W securely on the hand H, and transfer the substrate W by the hand H to the next process step.

Figure 17:
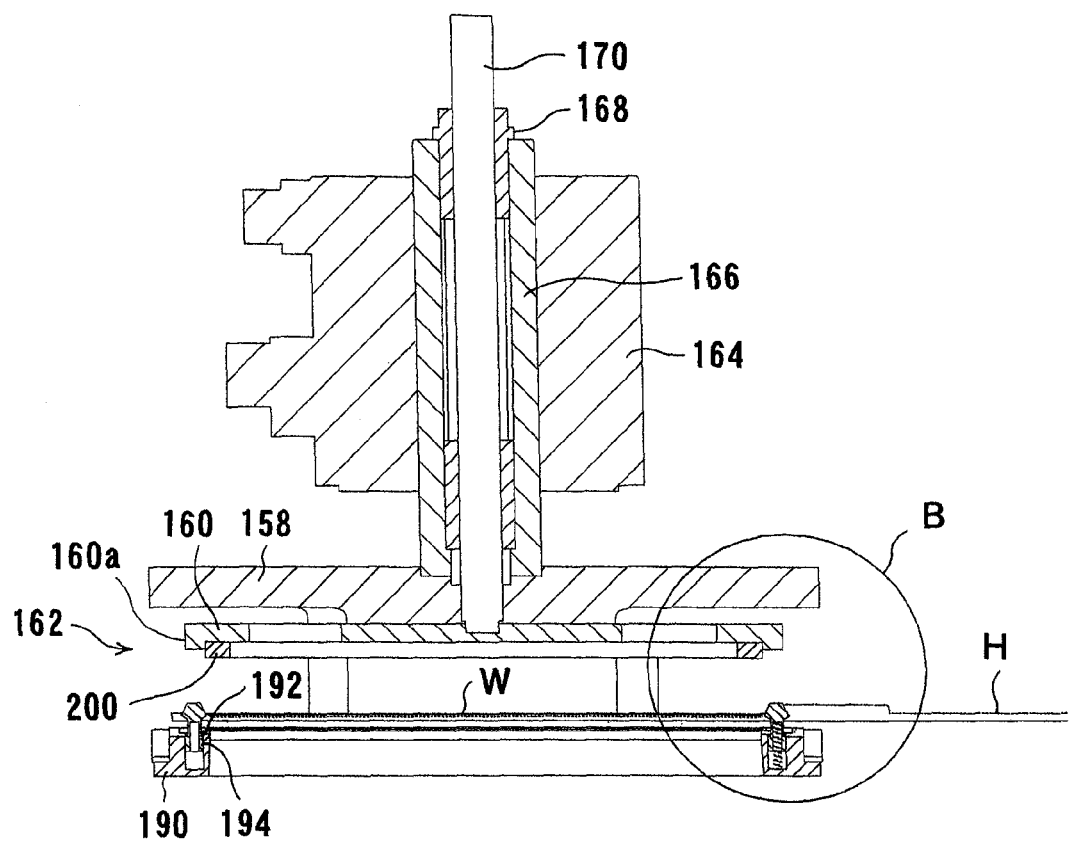
FIG. 17 is a cross-sectional view showing the processing head of the substrate processing unit upon insertion of a hand.
Figure 18:
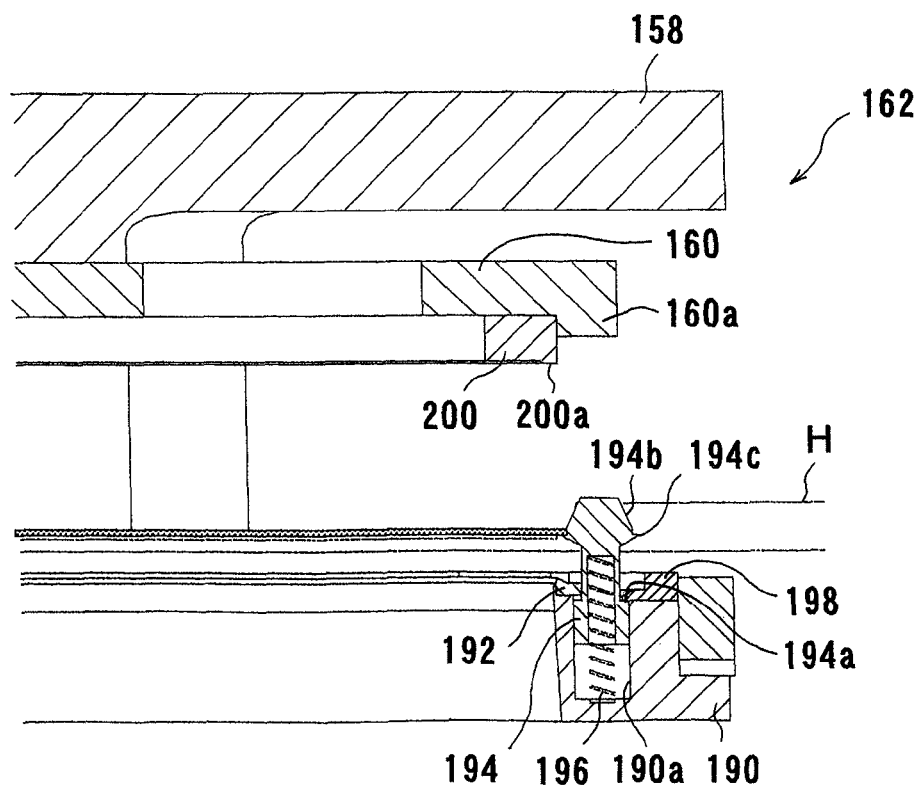
FIG. 18 is an enlarged view of the portion B of FIG. 17.

In operation, when the substrate holder 160 is in a raised position, the hand H, e.g. of a thin drop-in type, holding thereon a peripheral portion of the lower surface (front surface) of the substrate W, is inserted from the substrate insertion window 158a into the housing portion 158 so as to position the substrate W above the temporary retaining pins 194. The hand H is then lowered so as to place the substrate W at a predetermined position on the retaining portion 194c by the guide of the tapered surface 194b. FIGS. 17 and 18 show the processing head 162 upon insertion of the hand H. After further lowering the hand H, the hand H is drawn from the space S between the substrate W and the substrate receiving ring 190. Thereafter, the substrate holder 160 is lowered to fix the substrate W by nipping the peripheral portion between the seal ring 192 and the substrate fixing ring 200 in the above-described manner.

When the head-rotating servomotor 164 is driven while the substrate W is thus held in the processing head 162, the output shaft 166 and the vertical shaft 170 inserted in the output shaft 166 rotate together via the spline 168, whereby the substrate holder 160 rotates together with the housing portion 158.

Figure 10:
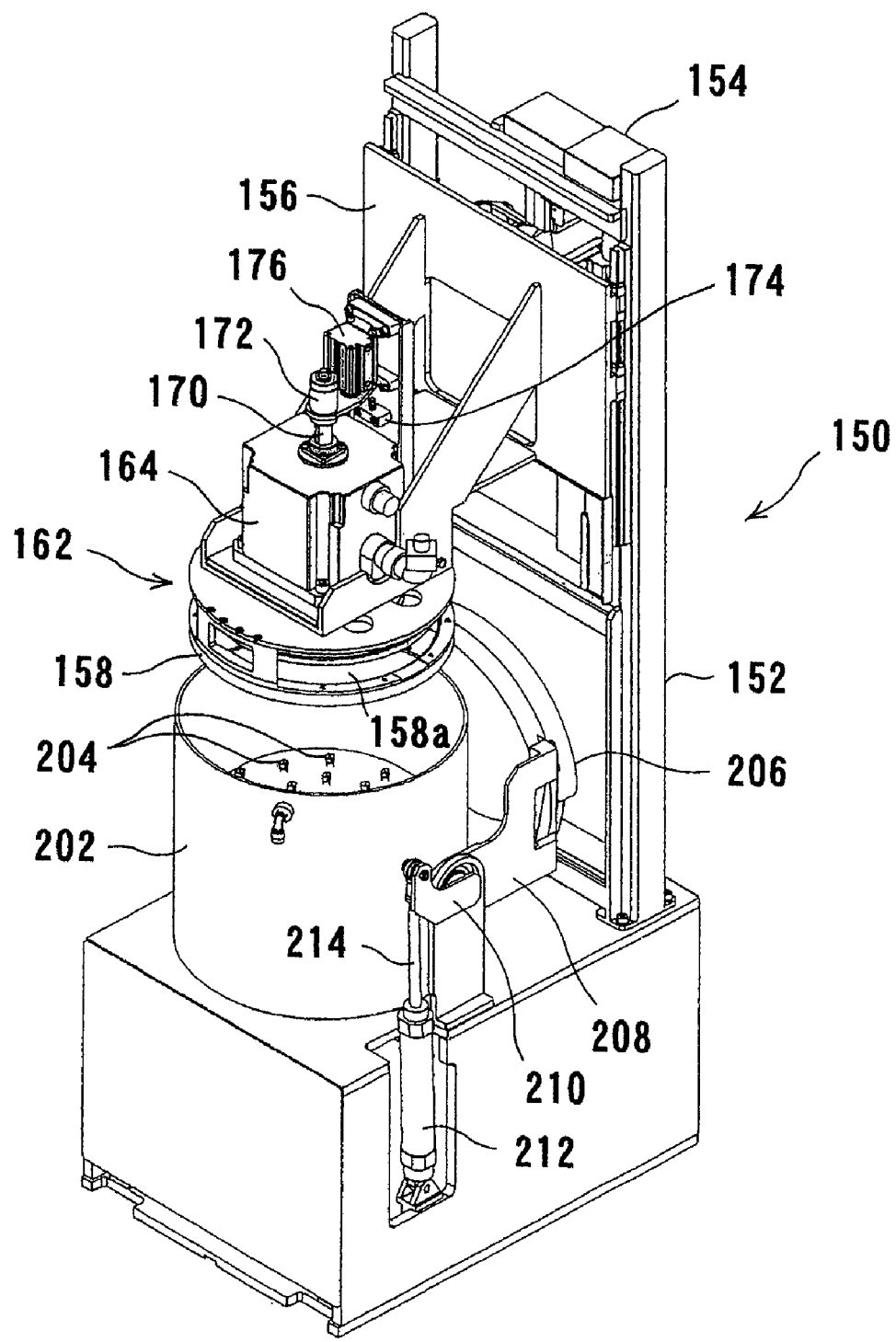
FIG. 10 is a perspective view of a substrate processing unit (pre-plating treatment unit) according to another embodiment of the present invention.
Figure 11:
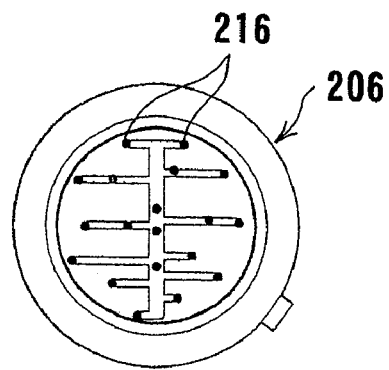
FIG. 11 is a backside view of a lid of FIG. 10.
Figure 12:
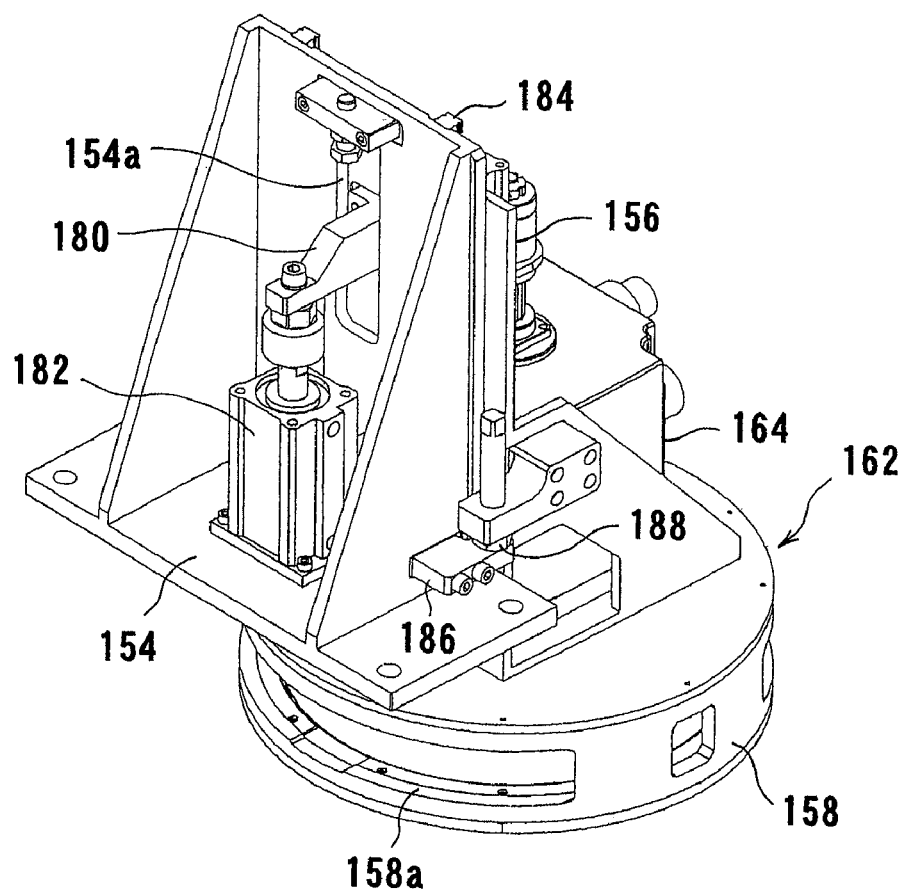
FIG. 12 is a perspective view showing a fixed frame, a movable frame and a processing head of the substrate processing unit.
Figure 13:
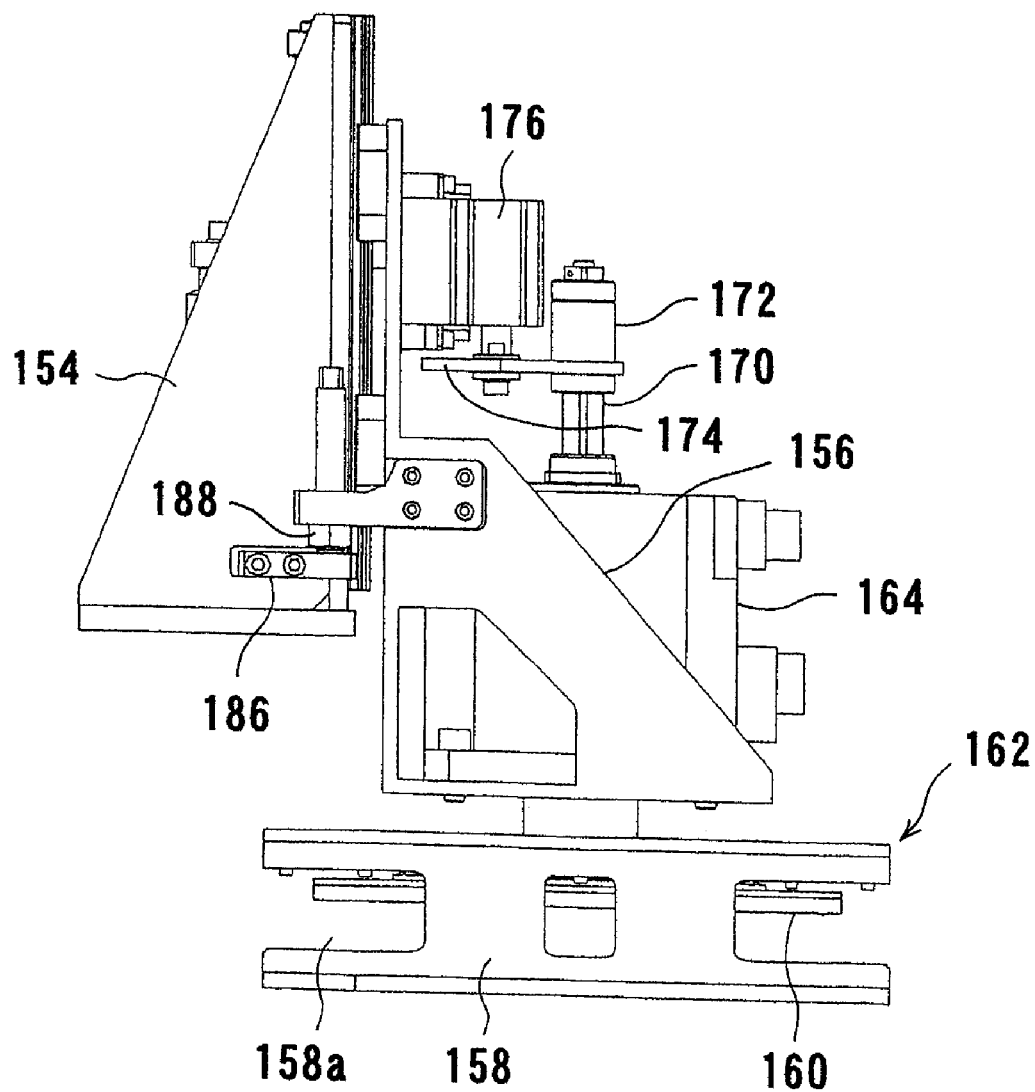
FIG. 13 is a front view showing the fixed frame, the movable frame and the processing head of the substrate processing unit.

As shown in FIGS. 10 through 11, positioned below the processing head 162, there is provided an upward-open treatment tank 202 having a slightly larger inner diameter than the outer diameter of the processing head 162. In the treatment tank 202 is disposed a plurality of sprays nozzles 204 for spraying upwardly a chemical liquid supplied from a chemical liquid supply source, which nozzles are distributed evenly over the entire cross-section of the treatment tank 202. A discharge pipe (not shown) for discharging out the chemical liquid (waste liquid) is connected to the bottom of the treatment tank 202.

A pair of leg portions 208, which is mounted to a lid 206, is rotatable supported on the outer circumferential surface of the treatment tank 202. Further, a crank 210 is integrally coupled to each leg portion 208, and the free end of the crank 210 is rotatably coupled to the rod 214 of a lid-moving cylinder 212. Thus, by the activation of the lid-moving cylinder 212, the lid 206 moves between a treatment position at which the lid 206 covers the top opening of the treatment tank 202 and a retreat position beside the treatment tank 202. In the surface (upper surface) of the lid 206 are provided a large number of pure water spray nozzles 216 for spraying outwardly (upwardly) pure water supplied from a pure water supply source.

By lowering the processing head 162 holding the substrate so as to cover or close the top opening of the treatment tank 202 with the processing head 162, and then spraying a chemical liquid from the spray nozzles 204 disposed in the treatment tank 202 toward the substrate W, the chemical liquid can be sprayed uniformly onto the entire lower surface (processing surface) of the substrate W and the chemical liquid can be discharged out from the discharge pipe while preventing scattering of the chemical liquid to the outside. Further, by raising the processing head 162 and closing the top opening of the treatment tank 202 with the lid 206, and then spraying pure water from the pure water spray nozzles 216 disposed in the upper surface of the lid 206 toward the substrate W held in the processing head 162, the chemical treatment of the substrate W and the pure water cleaning after the chemical treatment can be carried out successively, while the pure water can be prevented from flowing into the treatment tank 202, avoiding mixing of the two liquids.

According to the substrate processing unit 150, the substrate W is inserted into the processing head 162 and held therein when the processing head 162 is in the raised position. Thereafter, the processing head 162 is lowered to the position at which it covers the top opening of the treatment tank 202. While rotating the processing head 162 and thereby rotating the substrate W held in the processing head 162, a chemical liquid is sprayed from the spray nozzles 204 disposed in the treatment tank 202 toward the substrate W, thereby spraying the chemical liquid uniformly onto the entire surface of the substrate W. Thereafter, the processing head 162 is raised and stopped at a predetermined position, and the lid 206 in the retreat position is then moved to the position at which it covers the top opening of the treatment tank 202. Pure water is then sprayed from the pure water spray nozzles 216 disposed in the upper surface of the lid 206 toward the rotating substrate W held in the processing head 162. The chemical treatment and the pure water cleaning of the substrate W can thus be carried out successively while avoiding mixing of the two liquids.

The lowermost position of the processing head 162 may be adjusted to adjust the distance between the substrate W held in the processing head 162 and the spray nozzles 204, whereby the region of the substrate W onto which the chemical liquid is sprayed from the spray nozzles 204 and the spraying pressure can be adjusted as desired.

An acid solution, for example a $H_2SO_4$ solution, is used as the chemical liquid in the case of using the substrate processing unit 150 as the first cleaning treatment unit 28; a solution of $PdCl_2$ and HCl, for example, is used as the chemical liquid in the case of using the substrate processing unit 150 as the catalyst-imparting treatment unit 38; and a sodium citrate solution, for example, is used as the chemical liquid in the case of using the unit substrate processing 150 as the second cleaning treatment unit 40. In any case, the treated substrate is cleaned with pure water before it is sent to the next process step.

According to the substrate processing unit (pre-plating treatment unit) 150, when transferring the substrate W into the processing head 162 of the substrate processing unit 150, the substrate W is first placed and temporarily retained on the retaining portion 194c of the temporary retaining pin 194. When the substrate W is temporarily retained, a space S is formed between the substrate W and the substrate receiving ring 190, and a hand H can be drawn from the space S. Thus, it is possible to hold the substrate W on its lower surface side by a hand H e.g. of a thin drop-in type, and place and temporarily retain the substrate W on the retaining portion 194c of the temporary retaining pin 194 without a risk of fall of the substrate W. Further, by lowering the substrate holder 160, a peripheral portion of the substrate W can be nipped between the seal ring 192 and the substrate fixing ring 200 whereby the substrate W can be held securely. Further, by raising the substrate holder 160 after treatment, the substrate W can be securely detached from the seal ring 192 by the elastic force of the helical spring 196 even when the substrate W has adhered to the seal ring 192, and can be returned to the temporary retaining position. As with the above-described thin drop-in type hand H can be inserted into the space S, and can securely hold thereon the lower surface (front surface) of the substrate W and transfer the substrate W to the next process step.

As described hereinabove, according to the present invention, a space is formed between a substrate and the seal ring when temporarily retaining the substrate on the temporary retaining portion or taking the substrate out of the temporary retaining portion. A thin drop-in type hand, for example, can enter (or leave) the space and hold the lower surface of the substrate, enabling holding and transfer of the substrate without any risk of fall of the substrate. This makes it possible to shorten the time taken for holding the substrate and, in addition, raise the substrate transfer speed, thereby increasing the throughput.

Although certain preferred embodiments of the present invention have been shown and described in detail, it should be understood that various changes and modifications may be made therein without departing from the scope of the appended claims.

What is claimed is:

1. A substrate processing method, comprising:
   carrying out a cleaning treatment and a catalyst adhering treatment of a surface of a substrate as pre-plating treatments; and then
   electroless plating a metal film on the catalyst-adhered surface of the substrate,
   wherein said cleaning treatment is carried out while sealing a first peripheral portion of the surface of the substrate by bringing a first seal ring into contact with the first peripheral portion and said catalyst-adhering treatment is carried out while sealing a second peripheral portion of the surface of the substrate by bringing a second seal ring, which has a narrower opening area than that of the first seal ring, into contact with the second peripheral portion, so that the cleaning treatment is carried out in a concentrically wider area of the surface of the substrate than that area to which a catalyst is adhered with said catalyst-adhering treatment.

2. The substrate processing method according to claim 1, wherein said cleaning treatment, as one of said pre-plating treatments, comprises pre-cleaning prior to said catalyst-adhering treatment and cleaning after said catalyst-adhering treatment.

3. The substrate processing method according to claim 1, wherein the area of the surface of the substrate to which a catalyst is adhered by said catalyst-adhering treatment is the same area for which said electroless plating is carried out.

4. The substrate processing method according to claim 3, wherein said cleaning treatment, as one of said pre-plating treatments, comprises pre-cleaning prior to said catalyst-adhering treatment and cleaning after said catalyst-adhering treatment.

\* \* \* \* \*